United States Patent [19]

Nakagawa et al.

[11] Patent Number: 4,551,405

[45] Date of Patent: Nov. 5, 1985

[54] IMAGE FORMING PROCESS EMPLOYING MEMBER WITH A DEPLETION LAYER

[75] Inventors: Katsumi Nakagawa, Tokyo; Toshiyuki Komatsu, Kawasaki; Yutaka Hirai, Tokyo; Teruo Misumi, Toride; Tadaji Fukuda, Kawasaki, all of Japan

[73] Assignee: Canon Kabushiki Kaisha, Tokyo, Japan

[21] Appl. No.: 565,146

[22] Filed: Dec. 23, 1983

Related U.S. Application Data

[60] Division of Ser. No. 269,846, Jun. 3, 1981, Pat. No. 4,461,819, which is a continuation of Ser. No. 16,986, Mar. 2, 1979, abandoned.

[30] Foreign Application Priority Data

| Mar. 3, 1978 | [JP] | Japan | 53-24628 |
| Mar. 14, 1978 | [JP] | Japan | 53-29030 |
| Apr. 28, 1978 | [JP] | Japan | 53-51851 |

[51] Int. Cl.$^4$ .................. G03G 5/14; G03G 5/082
[52] U.S. Cl. ........................... 430/64; 430/84; 430/95; 430/130
[58] Field of Search .............. 430/59, 95, 65, 64, 430/130, 84

[56] References Cited

U.S. PATENT DOCUMENTS

| 4,064,521 | 12/1977 | Carlson | 427/39 |
| 4,123,269 | 10/1978 | Von Hoene | 96/1 |
| 4,134,764 | 1/1979 | Hoffman | 96/1.5 |
| 4,217,374 | 8/1980 | Ovshinsky et al. | 430/58 |
| 4,225,222 | 9/1980 | Kempter | 430/95 |
| 4,226,898 | 10/1980 | Ovshinsky et al. | 430/58 |
| 4,265,991 | 5/1981 | Hirai et al. | 430/65 |

FOREIGN PATENT DOCUMENTS

2855718  6/1979  Fed. Rep. of Germany ........ 430/84

OTHER PUBLICATIONS

Thompson, et al., Sputtered Amorphous Silicon Solar Cells, Proc. Int'l Photovoltaic Solar Energy Conf., Sep. 1977.
Moustakas, 23 Solid State Comm. pp. 155–158, (1977).
Sze, S. M., Physics of Semiconductor Devices, pp. 141–146, published by Wiley-Interscience.
RCA Experimenter's Manual, pp. 3 and 4, 1967, by RCA Corp.
J. Electrochemical Soc.; vol. 116, #1, pp. 77–81.
Applied Physics Letter, vol. 28, #2, p. 105.

*Primary Examiner*—John L. Goodrow
*Attorney, Agent, or Firm*—Fitzpatrick, Cella, Harper & Scinto

[57] ABSTRACT

Image-forming member for electrophotography comprising a charge generation layer composed of hydrogenated amorphous silicon.

21 Claims, 9 Drawing Figures

IMAGE FORMING PROCESS EMPLOYING MEMBER WITH A DEPLETION LAYER

This is a division of application Ser. No. 269,846 now U.S. Pat. No. 4,461,819, filed June 3, 1981, which in turn is a continuation of parent application Ser. No. 16,986, filed Mar. 2, 1979, now abandoned.

BACKGROUND OF THE INVENTION

1. Field of the Invention

This invention relates to an image-forming member for electrophotography which is used to form images by utilizing electromagnetic wave such as light including for example, ultraviolet ray, visible ray, infrared ray, x ray, gamma ray and the like.

2. Description of the Prior Art

Heretofore, there have been used inorganic photoconductive materials such as Se, CdS, ZnO and the like and organic photoconductive materials such as poly-N-vinylcarbazole, trinitrofluorenone and the like as a photoconductive material for photoconductive layers of electrophotographic image-forming members.

However, they are suffering from various drawbacks. For example, since Se has only a narrow spectral sensitivity range with respect to for example visible light, its spectral sensitivity is widened by incorporation of Te or As. As a result, an image-forming member of Se type containing Te or As is improved in its spectral sensitivity range, but its light fatigue is increased. On account of this, when the same, one original is to be continuously copied repeatedly, the density of the copied images is inadvantageously decreased, and fog occurs in the background of the image, and further undesirable ghost phenomenon takes place.

In addition, Se, As and Te are extremely harmful to man. Therefore, when an image-forming member is prepared, it is necessary to use a specially designed apparatus which can avoid contact between man and those harmful substances. Further, after preparation of an image-forming member having such a photoconductive layer formed of those substances, if the photoconductive layer is partly exposed, part of such layer is scraped off during the cleaning treatment for the image-forming member and mingles with developer, is scattered in copying machine and contaminates copied image, which causes contact between man and the harmful substances.

When Se photoconductive layer is subjected to a continuous and repetitive corona discharge, the electric properties are frequently deteriorated since the surface portion of such layer is crystallized or oxidized.

Se photoconductive layer may be formed in an amorphous state so as to have a high dark resistance, but crystallization of Se occurs at a temperature as low as about 65° C. so that the amorphous Se photoconductive layer is easily crystallized during handling, for example, at ambient temperature or by friction heat generated by rubbing with other members during image forming steps, and the dark resistance is lowered.

On the other hand, as for an electrophotographic image-forming member of binder type using ZnO, CdS and as photoconductive layer-constituting material, formation of the photoconductive layer having the desired properties is difficult because such layer consists of photoconductive material and binder resin and the former must be uniformly dispersed into the latter. Therefore, parameters for determining the electrical and photoconductive, or physical and chemical properties of the photoconductive layer must be carefully controlled in forming the desired photoconductive layer. Accordingly, the image-forming member having such photoconductive layer is not suitable for the mass production.

The binder type photoconductive layer is so porous that it is adversely affected by humidity and its electric properties are deteriorated when used at a high humidity, which results in formation of images having poor quality. Further, developer is allowed to enter into the photoconductive layer because of the porosity, which results in lowering release property and cleaning property. In particular, when the used developer is a liquid developer, the developer penetrates into the photoconductive layer so that the above disadvantages are enhanced.

CdS itself is poisonous to man. Therefore, attention should be paid so as to avoid contact with CdS and dispersion thereof.

ZnO photoconductive layer of binder type has low photosensitivity and narrow spectral sensitivity range and exhibits remarkable light fatigue and slow photoresponse.

Electrophotographic image-forming members comprising an organic photoconductive material such as poly-N-vinylcarbazole, trinitrofluorenone and the like have such drawbacks that the photosensitivity is low and the spectral sensitivity range with respect to for example the visible light region is narrow and in a shorter wave length region.

In order to solve the above mentioned problems, the present inventors have researched amorphous silicon (hereinafter called "a-Si") and succeeded in obtaining an electrophotographic photosensitive member free from these drawbacks.

Since electric and optical properties of a-Si film vary depending upon the manufacturing processes and manufacturing conditions and the reproducibility is very poor (Journal of Electrochemical Society, Vol. 116, No. 1, pp 77–81. January 1969). For example, a-Si film produced by vacuum evaporation or sputtering contains a lot of defects such as voids so that the electrical and optical properties are adversely affected to a great extent. Therefore, a-Si had not been studied for a long time. However, in 1976 success of producing p-n junction of a-Si was reported (Applied Physics Letters, Vol. 28, No. 2, pp. 105–107, 15 Jan. 1976). Since then, a-Si drew attentions of scientists. In addition, luminescence which can be only weakly observed in crystalline silicon (c-Si) can be observed at a high efficiency in a-Si and therefore, a-Si has been researched for solar cells (for example, U.S. Pat. No. 4,064,521).

However, a-Si developed for solar cells can not be directly used for the purpose of photoconductive layers of practical electrophotographic image-forming members.

Solar cells take out solar energy in a form of electric current and therefore, the a-Si film should have a low dark resistance for the purpose of obtaining efficiently the electric current at a good SN ratio [photo-current (Ip)/dark current (Id)], but if the resistance is so low, the photosensitivity is lowered and the SN ratio is degraded. Therefore, the dark resistance should be $1^5$–$10^8$ ohh.cm.

However, such degree of dark resistance is so low for photoconductive layers of electrophotographic image-forming members that such a-Si film can not be used for the photoconductive layers.

Photoconductive materials for electrophotographic apparatuses should have gamma value at a low light exposure region of nearly 1 since the incident light is a reflection light from the surface of materials to be copied and power of the light source built in electrophotographic apparatuses is usually limited.

Conventional a-Si can not satisfy the conditions necessary for electrophotographic processes.

Another report concerning a-Si discloses that when the dark resistance is increased, the photosensitivity is lowered. For example, an a-Si film having dark resistance of about $10^{10}$ ohm.cm shows a lowered photoconductive gain (photocurrent per incident photon). Therefore, conventional a-Si film can not be used for electrophotography even from this point of view.

Other various properties and conditions required for photoconductive layers of electrophotographic image-forming member such as electrostatic characteristics, corona ion resistance, solvent resistance, light fatigue resistance, humidity resistance, heat resistance, abrasion resistance, cleaning properties and the like have not been known as for a-Si films at all.

This invention has been accomplished in the light of the foregoing. The present inventors have continued researches and investigations with great zeal concerning application of a-Si to electrophotographic image-forming member. The invention is based on the discovery that lamination of a hydrogenated amorphous silicon (hereinafter called a-Si:H) layer and an organic compound layer described in the following provides an electrophotographic image-forming member which can be used with sufficient practicality and is extremely superior to the conventional image-forming member in almost all respects.

SUMMARY OF THE INVENTION

An object of the present invention is to provide an electrophotographic image-forming member, the preparing process for which is able to be carried out in an apparatus of a closed system to avoid the undesirable effects to man and which electrophotographic image-forming member is not harmful to living things as well as man and further to environment upon the use and therefore, causing no pollution.

Another object of the present invention is to provide an electrophotographic image-formng member which has moisture resistance, thermal resistance and constantly stable electrophotographic properties and is of all environmental type.

A further object of the present invention is to provide an electrophotographic image-forming member which has a high light fatigue resistance and a high corona discharging resistance, and is not deteriorated upon repeating use.

Still another object of the present invention is to provide an electrophotographic image-forming member which can give high quality images having a high image density, sharp half tone and high resolution.

A still further object of the present invention is to provide an electrophotographic image-forming member which has a high photosensitivity, a wide spectral sensitivity range covering almost all the visible light range and fast photoresponse properties.

Still another object of the present invention is to provide an electrophotographic image-forming member which has abrasion resistance, cleaning properties and solvent resistance.

A still further object of the present invention is to provide an electrophotographic image-forming member which requires few restrictions with respect to the period of time required until the commencement of development of electrostatic image since formation of such image and the period of time required for the development.

According to an aspect of the present invention, there is provided an image-forming member for electrophotography which comprises a charge generation layer for generating movable carrier by excitation of electromagnetic wave, said charge generation layer being composed of hydrogenated amorphous silicon, a charge transport layer into which carrier generated in said charge generation layer is injected and which transports the injected carrier, said charge transport layer being composed of an organic compound, and a substrate for electrophotography on which said charge generation layer and charge transport layer are overlaid.

According to another aspect of the present invention, there is provided an image-forming member for electrophotography which comprises a substrate for electrophotography and a charge generation layer, said charge injection layer being sensitive to electromagnetic wave and having a depletion layer formed by junction of two layers composed of two types of hydrogenated amorphous silicons having different electric properties, said depletion layer acting as a layer generating movable carrier when said layer is subjected to action of electromagnetic wave.

DESCRIPTION OF THE PREFERRED EMBODIMENTS

Representative examples of the electrophotographic image forming member are shown in FIGS. 1-6.

Figure 1:
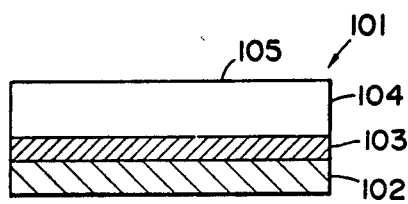
FIGS. 1-6 are schematic cross-sectional views of preferred examples of electrophotographic image-forming members according to the present invention.

An electrophotographic image forming member 101 in FIG. 1 contains a substrate 102, a charge generation layer 103 capable of generating movable carriers by electromagnetic wave excitation, and a charge transport layer 104 composed of an organic compound which the carriers generated in the layer 103 are efficiently injected into and which transports the carriers. Layer 104 has a free surface 105.

Charge generation layer 103 according to the present invention can generate movable carriers by action of electromagnetic wave when irradiated by the electromagnetic wave as one step of a process for forming electrostatic images on image forming member 101.

According to the present invention, since charge generation layer 103 should have a function as mentioned above, it is necessary that carriers enough to form electrostatic images having a substantially good contrast generate in charge generation layer 103. In other words, either substrate 102 or layer 104 is preferably formed in such a way that the electromagnetic wave sufficiently reaches charge generation layer 103.

For example, in FIG. 1, when an electromagnetic wave is projected from the side of layer 104, material and thickness of layer 104 are to be selected in such a manner that the electromagnetic wave passes through layer 104 and reaches layer 103 and the amount of the electromagnetic wave is enough to generate a sufficient amount of carrier in layer 103. On the contrary, when an electromagnetic wave is projected from the side of substrate 102, the substrate 102 is to be made taking the conditions as mentioned above into consideration.

The order of layers of image forming member 101 in FIG. 1, that is, substrate 102, layer 103, and layer 104, may be changed. For example, substrate 102 is mounted on layer 104 and as the result, layer 103 has a free surface. In such layer structure, when an electromagnetic wave is projected from the side of layer 103, it is not necessary to select layer 104 and substrate 102 by taking the above mentioned conditions into consideration. On the contrary, when an electromagnetic wave is projected from the side of substrate 102, it is necessary to select layers 102 and 104 in such a manner that a sufficient amount of the electromagnetic wave reaches layer 103 so as to form a sufficient amount of carrier.

Substrate 102 may be conductive or insulating. Examples of conductive substrates are metals such as Al, Cr, Mo, Au, Ir, Nb, Ta, V, Ti, Pt, Pd and the like, their alloys, stainless steels, and the like. Examples of insulating substrates are films or sheets of synthetic resins such as polyesters, polyethylene, polycarbonates, cellulose triacetate, polypropylene, polyvinyl chloride, polyvinylidene chloride, polystyrenes, polyamides and the like, glass, ceramics, paper and the like.

At least one surface of the insulating substrate is preferably conductivized and another layer is mounted on said conductivized surface. For example, in case of glass, the substrate is conductivized with $In_2O_3$, $SnO_2$ or the like, and in case of a synthetic resin film such as a polyester film, the surface is conductivized by vacuum vapor deposition, electron beam vapor deposition, sputtering or the like using Al, Ag, Pb, Zn, Ni, Au, Cr, Mo, Ir, Nb, Ta, V, Ti, Pt or the like, or by laminating with such metal.

The shape of substrate may be a type of drum, belt, plate or other optional shape. When a continuous high speed copying is desired, an endless belt or drum shape is desirable.

Thickness of the substrate may be optionally determined so as to produce a desired electrophotographic image forming member. When the electrophotographic image forming member is desired to be flexible, it is preferable that the substrate is as thin as possible. However, in such a case the thickness is usually more than 10 microns from the viewpoints of manufacturing, handling and mechanical strength of the substrate.

The charge generation layer according to the present invention (e.g. layer 103 in FIG. 1) is composed of a hydrogenated amorphous silicon (hereinafter called a-Si:H) of the following type.

1. n-type a-Si:H

Containing a donor only or containing both a donor and an acceptor where the content of donor (Nd) is higher.

2. $N^+$-type a-Si:H

A type of 1 which has a particularly strong n-type characteristic (Nd is much higher).

3. p-type a-Si:H

Containing an acceptor only or containing both an acceptor and a donor where the content of acceptor (Na) is higher.

4. $p^+$-type a-Si:H

A type of 3 which has a particularly strong p-type characteristic (Na is much higher).

5. i-type a-Si:H where $Na \simeq Nd \simeq 0$ or $Na \simeq Nd$.

a-Si:H which constitutes, for example, layer 103 and satisfies the conditions as described below has the following excellent characteristics so that electrophotographic image forming members produced from the a-Si:H have various excellent electrophotographic characteristics.

Since the light absorption coefficient is as large as $10^4$ $cm^{-1}$ or more in the visible light region, it is possible to thin the charge generation region in the direction of thickness of the layer to be formed, generate charges in a high concentration and enhance the charge injection efficiency to a great extent.

The a-Si:H according to the present invention gives only a little amount of charge carrier formed by thermal excitation and therefore, the dark resistivity can be $10^{12}$ ohm.cm or more and the dark decay is low as is clear from 0.5 m/sec. or more of the time constant. The light response time is as fast as 1 m/sec. or less. Therefore, according to the present invention, there can be obtained electrophotographic image forming members of excellent electrophotographic characteristics and suitable for a high speed copying.

Charge generation layer 103 may be produced on substrate 102 by depositing a-Si:H on substrate 102 in a desired thickness by glow discharge, sputtering, ion plating, ion implantation or the like.

These manufacturing methods may be optionally selected depending upon manufacturing conditions, capital investment, manufacture scales, electrophotographic properties and the like. Glow discharge is preferably used because controlling for obtaining desirable electrophotographic properties is relatively easy and impurities of Group III or Group V of the Periodic Table can be introduced into the charge generation layer composed of a-Si:H in a substitution type for the purpose of controlling the characteristics.

Further, according to the present invention, glow discharge and sputtering in combination can be conducted in the same system to form the charge generation layer.

According to the present invention, the charge generation layer 103 is composed of hydrogenated a-Si for the purpose of enhancing dark resistivity and photosensitivity of the electrophotographic image forming member.

A charge generation layer 103 composed of a-Si:H may be prepared by incorporating hydrogen in the layer upon forming the layer 103 according to the following method.

In the present invention, "H is contained in a layer" means one of, or a combination of the state, i.e. "H is bonded to Si", and "ionized H is weakly bonded to Si in the layer" and "present in the layer in a form of $H_2$".

In order to incorporate H in layer 103, a silicon compound such as silanes, for example, $SiH_4, Si_2H_6$, and the like is introduced into a deposition system upon forming layer 103 and then heat-decomposed or subjected to glow discharge to decompose the compound and incorporate H as layer 103 grows.

For example, when charge generation layer 103 is produced by a glow discharge, a silicon hydride gas such as $SiH_4$, $Si_2H_6$ and the like may be used as the starting material for forming the a-Si and, therefore, H is automatically incorporated in layer 103 upon formation of layer 103 by decomposition of such silicon hydride.

Where reactive sputtering is employed, in a rare gas such as Ar or a gas mixture atmosphere containing a rare gas the sputtering is carried out with Si as a target while introducing $H_2$ gas into the system or introducing a silicon hydride gas such as $SiH_4$, $Si_2H_6$ and the like or introducing $B_2H_6$, $PH_3$ or the like gas which can act as a source of impurities for doping layer 103.

The present inventors have found that an amount of H in layer 103 composed of a-Si:H is a very important factor which determines whether the electrophotographic image forming member can be practically used.

Practically usable electrophotographic image forming members usually contain 1–40 atomic percent, preferably, 5–30 atomic percent of H in the charge generation layer 103. When the content of H is outside of the above range, the electrophotographic image forming member has a very low or substantially no sensitivity to electromagnetic wave, and increase in carrier when irradiated by electromagnetic wave is a little and further the dark resistivity is markedly low.

Controlling an amount of H to be contained in the charge generation layer 103 can be effected by controlling the deposition substrate temperature and/or an amount of a starting material introduced into the system which is used for incorporating H.

In order to produce a charge generation layer 103 having a type selected from 1–5 as mentioned as above, upon conducting glow discharge or reactive sputtering, the charge generation layer is doped with an n-type impurity (the charge generation layer is rendered a type 1 or 2), a p-type impurity (the charge generation layer is rendered a type 3 or 4), or with both of them while the amount of impurity to be added is controlled. According to the present inventors' discovery, by controlling the concentration of impurities in a-Si to a range of $10^{15}$–$10^{19}$ cm$^{-3}$ there can be obtained a-Si:H having a property ranging from a stronger n-type (or a stronger p-type) to a weaker n-type (or a weaker p-type).

As an impurity used for doping a Si:H to make the a-Si:H p-type there may be mentioned elements of Group III A of the Periodic Table such as B, Al, Ga, In, Tl and the like, and as an impurity for doping a-Si:H to make the a-Si:H n-type, there may be mentioned elements of Group V A of the Periodic Table such as N, P, As, Sb, Bi and the like.

These impurities are contained in the a-Si:H in an order of ppm. so that problem of pollution is not so serious as that for a main component of a photoconductive layer. However, it is naturally preferable to pay attention to such problem of pollution. From this viewpoint, B, As, P and Sb are the most appropriate taking into consideration electrical and optical characteristics of the charge generation layer to be produced.

An amount of impurity with which a-Si:H is doped may be appropriately selected depending upon electrical and optical characteristics of the charge generation layer. In case of impurities of Group III A of the Periodic Table, the amount is usually $10^{-6}$–$10^{-3}$ atomic percent, preferably, $10^{-5}$–$10^{-4}$ atomic percent, and in case of impurities of Group V A of the Periodic Table, the amount is usually $10^{-8}$–$10^{-3}$ atomic percent, preferably $10^{-8}$–$10^{-4}$ atomic %.

The a-Si:H may be doped with these impurities by various methods depending upon the type of method for preparing the a-Si:H. These will be mentioned later in detail.

Figure 2:
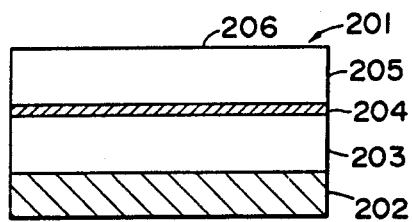

According to the present invention, in case of FIG. 1 and FIG. 2, thickness of the charge generation layer (e.g. 103) is usually more than 0.1 micron so as to obtain a practically sufficient amount of charge produced by excitation with an electromagnetic wave.

On the other hand, the upper limit of the thickness is usually 10 microns, preferably 7 microns from the viewpoint of shortening the time required for producing the charge generation layer composed of a-Si:H and decreasing the manufacturing cost though the thickness usually used in the field of electrophotography may be employed.

According to the present invention, the charge transport layer 104 is a layer into which carriers generated in the charge generation layer 103 is efficiently injected and which effectively transports the carriers thus injected. Therefore, layer 104 is made of a material capable of effectively transporting the injected carriers and is mounted on layer 103 in such a manner that layer 104 is electrically contacted with layer 103 so as to facilitate the injection of carriers from layer 103.

Materials for layer 104 capable of satisfying such conditions are, for example, organic compounds since many organic compounds have film-shapeability, adhesivity and the required electric resistance.

Among the organic compounds, organic photoconductive materials can be preferably used.

Representative organic photoconductive materials for the charge transport layer 104 are:

carbazoles such as polyvinylcarbazole (PVK), carbazole, N-ethylcarbazole, N-isopropylcarbazole, N-phenylcarbazole and the like;

pyrenes such as pyrene, tetraphenylpyrene, 1-methylpyrene, azapyrene, 1-ethylpyrene, 1,2-benzpyrene, 3,4-benzpyrene, 4,5-benzpyrene, acetylpyrene, 1,4-bromopyrene, polyvinylpyrene and the like;

anthracene, tetracene, tetraphene, perylene, phenanthrene, 2-phenylnaphthalene, and the like;

chrysenes such as chrysene, 2,3-benzochrysene, picene, benzo[b]chrysene, benzo[c]chrysene, benzo[g]chrysene and the like;

phenylindole and the like;

aromatic heterocyclic polyvinyl compounds such as polyvinyltetracene, polyvinylperylene, polyvinylpyrene, polyvinyltetraphene and the like;

polyacrylonitrile and the like;

fluorene, fluorenone and the like;

polyazophenylene and the like;

pyrazoline derivatives such as 2-pyrazoline, pyrazoline hydrochloride, pyrazoline picrate, N-p-tolylpyrazoline and the like;

polyimiazopyrrolone, polyimidimidazopyrrolone, and the like;

polyimide, polyimidoxazole, polyamidobezimidazole, poly-p-phenylene and the like;

erythrosine and the like;

2,4,7-trinitro-9-fluorenone (TNF), PVK:TNF, 2,4,5,7-tetranitrofluorenone and the like; and dinitroanthracene, dinitroacridine, tetracyanophyrene, dinitroanthraquinone and the like.

In FIG. 1, a layer having a function similar to that of layer 104 may be additionally formed between layer 103 and substrate 102.

Thickness of the charge transport layer 104 may be optionally selected depending upon the requested properties of layer 104 and a relation with layer 103. It is usually 5–80 microns, preferably 10–50 microns.

It is preferred to dispose a barrier layer capable of preventing injection of carriers from the substrate 102 side upon electroconductivizing for forming electrostatic images between substrate 102 and a layer disposed on said substrate in case of an image forming member where charge transport layer 104 or charge generation layer 103 has a free surface and the free surface is electroconductivized for forming electrostatic images.

Materials for such barrier layer may be optionally selected depending upon the type of substrate 102 and electric properties of a layer disposed on substrate 102.

Representative materials for the barrier are $MgF_2$, $Al_2O_3$, $SiO$, $SiO_2$ and the like insulating inorganic compounds, polyethylene, polycarbonates, polyurethanes, poly-para-xylylene and the like insulating organic compounds, and Au, Ir, Pt, Rh, Pd, Mo and the like metals.

In FIG. 2, electrophotographic image forming layer 201 is composed of a covering layer 205 having a free surface 206, a charge generation layer 204 composed of a-Si:H, a charge transport layer 203 composed of an organic compound and a substrate 202, and is substantially the same as the image forming member 101 in FIG. 1 except that the covering layer is contained. However, the properties required for the covering layer 205 are different from one another depending upon the electrophotographic process employed. For example, when an electrophotographic process of U.S. Pat. Nos. 3,666,364 or 3,734,609 is employed, the covering layer 205 is insulating and electrostatic charge retentivity when electroconductivized is sufficiently high and thickness of the layer is thicker than a certain value. On the contrary, in case of an electrophotographic process such as Carlson process, thickness of the covering layer 205 is required to be very thin since it is desired that electric potential at the light portion is very small. Covering layer 205 is disposed taking into consideration the required electric properties, and further covering layer 205 should not adversely affect chemically or physically the charge generation layer 204 and the charge transport layer 203 which the covering layer is contacted with, and additionally, covering layer 205 is formed taking an electrical contact property and an adhesivity with respect to a layer which the covering layer contacts, and humidity resistance, abrasion resistance, cleaning property and the like.

Thickness of covering layer 205 is optionally determined depending upon the required properties and the type of material used. It is usually 0.5–70 microns.

When covering layer 205 is required to have a protective function, the thickness is usually less than 10 microns while when it is required to behave as an electrically insulating layer, the thickness is usually more than 10 microns.

However, these values of thickness for a protective layer and for an insulating layer are only examples and may vary depending upon type of the material, type of the electrophotographic process employed and structure of the electrophotographic image forming member, and therefore the thickness, 10 microns, is not always a critical value.

Figure 3:
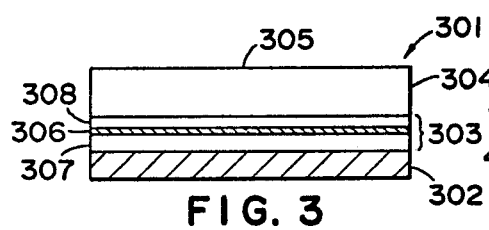

Referring to FIG. 3, electrophotographic image forming member 301 comprises a substrate 302, a charge generation layer 303, and a charge transport layer 304. Charge generation layer 303 contains a depletion layer 306, and layer 304 has a free surface 305.

The image forming member 301 in FIG. 3 is substantially the same as the member 101 in FIG. 1 except that structure of the charge generation layer 303 is different from that of layer 103. The depletion layer 306 produces movable carriers when irradiated by an electromagnetic wave at a step of electromagnetic wave irradiation in a process of forming electrostatic images on the image forming member 301.

One of substrate 302 and layer 304 should be formed in such a manner that carriers sufficient to form electrostatic images having a substantially sufficient contrast are produced in the depletion layer 306 depending upon the direction in which the electromagnetic wave is projected to the image forming member 301, that is, the electromagnetic wave sufficiently reaches the depletion layer 306. In this point, the situation is similar to FIG. 1.

The order of disposing layers 302, 303 and 304 does not limit the present invention, but the order may be changed, for example, layer 302 may overlie layer 304 and layer 303 has a free surface. In case of the latter order of layer arrengement, when electromagnetic wave is projected from the side of layer 303, it is not necessary to pay particular attention to layer 304 and substrate 302 with respect to reaching of electromagnetic wave to depletion 306. On the contrary, when electromagnetic wave is projected from the side of substrate 302, materials for substrate 302 and layer 304 and thickness of each layer should be selected in such a manner that electromagnetic wave reaches depletion layer 306 so as to generate sufficient carriers at depletion layer 306.

The depletion layer 306 may be formed in layer 303 by selecting at least two kinds of a-Si:H of 1–5 types and forming layer 303 in such a way that two different kinds of materials are brought into junction. In other words depletion layer 306 may be formed as a junction portion between an i-type a-Si:H layer and a p-type a-Si:H layer by forming an i-type a-Si:H layer on substrate 302 having desired surface characteristics and forming a p-type a-Si:H layer on said i-type layer.

Hereinafter, an a-Si:H layer on a substrate 302 side with respect to a depletion layer 306 is called an inner layer while that on a free surface 305 side is called an outer layer. In other words, a depletion layer 306 is formed at a transition region in the junction between an inner a-Si:H layer and an outer a-Si:H layer when a charge generation layer 303 is produced in such a way that two different types of a-Si:H layers.

At a normal state, the depletion layer 306 is in a state that free carriers are depleted and therefore it shows a behavior of so-called intrinsic semiconductor.

In the present invention, an inner layer 307 and an outer layer 308 which are constituting a charge generation layer 303 are composed of the same a-Si:H and the junction portion (depletion layer 306) is a homojunction and therefore, inner layer 307 and outer layer 308 form a good electrical and optical junction and the energy bands of the inner layer and the outer layer are smoothly joined. Further, in depletion layer 306 there exists an intrinsic electric field (diffusion potential) (inclination of energy band) when depletion layer 306 is formed. Thus, a carrier forming efficiency is enhanced and in addition, recombination probability of the formed carrier is decreased, that is, the quantum efficiency is increased and light response becomes fast and formation of residual charge is prevented.

In view of the foregoing, carriers produced in depletion layer 306 by irradiation of an electromagnetic wave such as light advantageously work effectively to form electrostatic images.

The image forming member according to the present invention is electroconductivized on the free surface in such a manner that the charge polarity capable of applying a voltage of reverse bias to depletion layer 306 when electrostatic images are formed. When this reverse bias is applied to the depletion layer, thickness of depletion layer 306 increases at a rate of about ½ power of the voltage applied to depletion layer 306. For example, at a high voltage (higher than $10^4$ V/cm), thickness of depletion layer 306 is several or several tens times that when it is not electroconductivized. Further, application of reverse bias to depletion layer 306 makes the intrinsic electric field (diffusion potential) formed by the junction steep. This renders the above mentioned effect more remarkable.

According to the present invention, as mentioned previously, the inner layer 307 and the outer layer 308 are composed of the same material, and the depletion layer 306 is formed by junction between inner layer 307 and outer layer 308 and therefore, the whole charge generation layer 303 can be advantageously formed by a continuous manufacturing process.

Thickness of depletion layer 306 can be determined by difference of Fermi level before joining inner layer 307 and outer layer 308 to be joined and dielectric constants of these layers, that is concentration of impurities doping the layer so as to control the a-Si:H layer to be joined to the type of 1–5 above. In particular, by controlling doping amount of the impurities the thickness can be changed to several tens Å to several microns.

As mentioned above, when reverse bias is applied, thickness of the depletion layer 306 can be increased so that it can be increased up to several hundred Å to several tens microns. Therefore, thickness of depletion layer 306 varies depending upon the degree of reverse bias.

However, when a reverse bias of a high electric field is applied to depletion layer 306, it is necessary to determine the concentration of impurities and voltage to be applied as mentioned below in such a manner that neither tunneling nor avalanche breakdown is caused. In other words, when the concentration of impurities is so high, even a relatively low reverse bias causes tunneling and avalanche breakdown and therefore, a sufficient broadening of the depletion layer 306 (decrease in electric capacity) and a sufficient electric field to the depletion layer 306 can not be obtained.

According to the present invention, depletion layer 306 plays a role of absorbing electromagnetic wave to produce carriers and therefore, it is desirable to use a thick layer so as to absorb the electromagnetic wave incident on depletion layer 306 as far as possible. However, on the other hand, the intensity of intrinsic electric field formed in depletion layer 306 per unit thickness, an important factor which lowers recombination probability of carriers formed in depletion layer 306, is inversely proportional to thickness of the layer. Therefore, as far as this point is concerned, a thinner depletion layer 306 is preferable.

In view of the foregoing, in case of an image forming member 301 in FIG. 3, the following two points should be considered so as to attain sufficiently the purpose. That is, according to the present invention, formation of carriers by irradiation of electromagnetic wave is mostly effected in depletion layer 306 so that it is necessary to form either inner layer 307 or outer layer 308 depending upon the direction of irradiation of electromagnetic wave to an image forming member 301 in such a manner that carriers sufficient to form electrostatic images having a sufficient contrast are produced in depletion layer 306, that is the irradiated electromagnetic wave sufficiently reaches the depletion layer.

In case of usual electrophotographic image forming members, visible light is used as the electromagnetic wave. Therefore, it is necessary for the purpose of attaining the above purpose to form one of inner layer 307 and outer layer 308 as a layer at the electromagnetic wave irradiating side in such a manner that at least one part of the depletion layer 306 is present within a distance of 5000 Å from the surface of the electromagnetic wave irradiation side of the charge generation layer 303 when electroconductivized since the light absorption coefficient of a-Si:H ranges from $5 \times 10^5$ to $10^4$ cm$^{-1}$ at a wavelength range of 400–700 nm.

In addition, with respect to the lower limit of thickness of one of inner layer 307 and outer layer 308 at electromagnetic wave irradiation side, since it is necessary only that a depletion layer 306 is formed by junction between inner layer 307 and outer layer 308, the thinner the charge generation layer, the higher the carrier generation efficiency in depletion layer 306 with respect to an irradiation amount of electromagnetic wave. Therefore, a thin charge generation layer is preferable as far as the manufacturing technique is available.

When an a-Si:H layer is rendered p-type (including p$^+$-type) or n-type (including n$^+$-type), the dark resistance varies to a great extent depending upon the concentration of impurities and most of the layer can not be used for electrophotography since the dark resistance is too low.

This reason is that when the resistance is so low, the surface resistance is not enough to prevent electric charge from escaping to a traverse direction upon forming electrostatic images and therefore, highly sensitive latent images can not be obtained and there is not a difference in amount between thermal excited free carrier and light excited free carrier and thereby electrostatic latent images can not be formed.

However, in the present invention, even in case of an electrophotographic image forming member having a charge generation layer formed as a free surface, there is a broadening of thickness of a depletion layer caused by application of a reverse bias to the depletion layer. This fact means that free carriers are ejected and this results in that even when resistance of the outer layer is relatively low, the outer layer behaves as a high resistance in appearance.

Further, charging in a direction to a reverse bias ejects free carriers in the outer layer to a direction of the surface and thereby causes a similar change in the outer layer.

Consequently, as a material for constituting the outer layer, there can be used a material which gives a broadening effect of a depletion effect and an ejection effect of free carriers as explained above as far as the degrees of these effects are enough to attain the purpose of the present invention even if the material is of a relatively low electric resistance and therefore, has been thought unusable.

A layer which is not at the electromagnetic wave irradiation side, i.e. one of inner layer 307 and outer layer 308, (a layer which is at a side opposite to the electromagnetic wave irradiation side with respect to depletion layer 306), can be formed in such a manner that it functions to transport effectively charges generated in the depletion layer 306 and, in addition, can contribute to electric capacity of charge generation layer 303.

In view of the foregoing, such layer is formed usually in the thickness of 0.1–10 microns, preferably, 0.1–7 microns taking into consideration economy including manufacturing cost and manufacturing time of the image forming member.

In FIG. 3, there is shown a preferred embodiment of an image forming member of the present invention, that is an inner layer 307 and an outer layer 308 are two different types of a-Si:H layers selected from 1–5 types and joined to form a charge generation layer 303 and its superiority to prior art is explained. The above mentioned selection is made, for example, a combination of p-type and i-type, p$^+$-type and i-type, n$^+$-type and i-type, or p-type and n-type.

Furthermore, a charge generation layer composed of junction of three different types of a-Si:H layers selected from 1–5 types is also a preferred embodiment of the present invention. The combination of p.i.n or n.i.p from the side of substrate 302. In this case, there are two depletion layers in a charge generation layer.

In this case, it is possible to apply a large electric field since a high electric field can be applied to the divided two depletion layers and thereby it becomes easy to obtain a high surface potential.

When a charge generation layer has a layer-structure of p.i.n or n.i.p from the substrate side, the following feature exists and various electrophotographic processes can be applied. Injection of charge into a charge generation layer from the substrate side can be prevented. Further, since it is possible to irradiate electromagnetic wave from both the surface side and the substrate side, irradiating both sides by the same image or a simultaneous add on system by irradiation of different images are possible. And further, it is possible to irradiate from the back side for eliminating electrostatic images (irradiation from the substrate side) or irradiate from the back side by the later mentioned NP system (accelerating a charge injection from the substrate side) or irradiate from the back side so as to enhance the durability.

Figure 4:
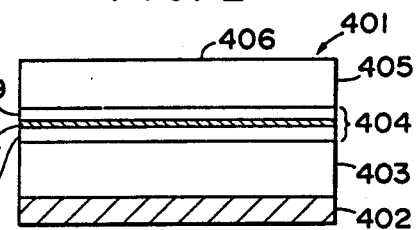

Referring to FIG. 4, an electrophotographic image forming member 401 has a covering layer 405 having a free surface 406, a substrate 402, a charge transport layer 403, and a charge generation layer 404 composed of an inner layer 408 and an outer layer 409 and a depletion layer 407 in said layer.

The member 401 is substantially the same as the image forming member 1 in FIG. 3 except the covering layer.

In the image forming member having a depletion layer in the charge generation layer as illustrated in FIGS. 3 and 4, the concentration of impurities doping a-Si:H layers of 1–5 types which can form inner layer and outer layer may be as mentioned previously. It is preferable for forming a particularly effective depletion layer to select Na and Nd in such a manner that the value of NaNd/(Na+Nd) in the charge generation layer is within the following range.

When a particular reverse bias voltage is applied to a depletion layer, the upper limit of NaNd/(Na+Nd) is determined in such a manner that neither tunneling nor avalanche breakdown occurs. It is usually, for example, about $10^{18}$ cm$^{-3}$. As the lower limit, it is usually the number of free dangling bond of Si per unit volume in the charge generation layer, N, and it is preferably more than N by ½ place or more, particularly preferably one place or more.

Figure 5:
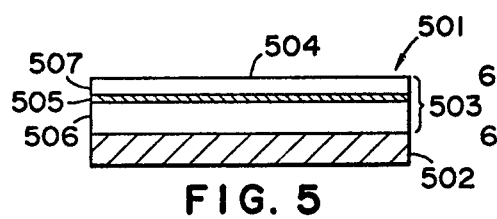
Figure 6:
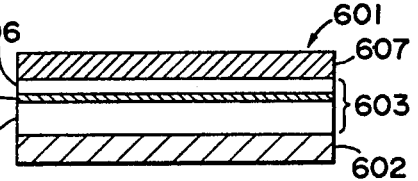

Other embodiments of the present invention are shown in FIG. 5 and FIG. 6.

Referring to FIG. 5, an electrophotographic image forming member 501 is substantially the same as the image forming member 301 in FIG. 3 except that there is not a charge transport layer.

The member 501 consists of a substrate 502 and a charge generation layer 503 composed of a-Si:H. The layer 503 has a free surface 504 on which images are formed and the layer 503 contains a depletion layer 505. Inner layer 506 and outer layer 507 are composed of a-Si:H selected from 1–5 types as explained in FIG. 3 concerning an image forming member 301.

Referring to FIG. 6, an image forming member 601 is substantially the same as the image forming member 501 in points of layer-structure and layer forming materials except that a covering layer 607 similar to a covering layer 405 in FIG. 4 on a charge generation layer 603, that is, the member 601 consists of a substrate 602, a charge generation layer 603 in which an inner layer 605 and an outer layer 606 are joined to form a depletion layer 604, and the above mentioned covering layer 607.

The charge generation layer of electrophotographic image forming members according to the present invention may be prepared by glow discharge and sputtering.

Figure 7:
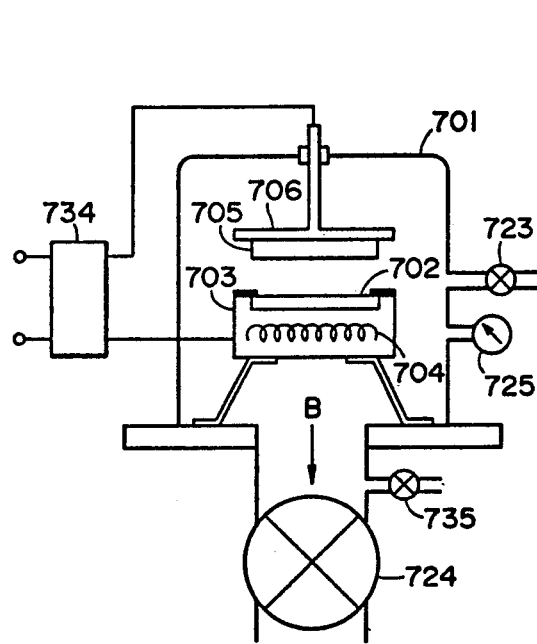
FIG. 7 is a schematic illustration of an apparatus which is used to prepare an electrophotographic image-forming member of the present invention in accordance with the sputtering method.

Referring to FIG. 7, an apparatus for producing a charge generation layer by sputtering is shown.

A deposition chamber 701 contains a substrate 702 which is fixed to a conductive fixing member 703 electrically isolated from deposition chamber 701. A charge generating layer is formed on the substrate 702.

Below substrate 702 is disposed heater 704 for heating substrate 702. At the upper portion there is disposed a polycrystal or single crystal silicon target 705 on an electrode for sputtering in a position facing substrate 702.

Between fixing member 703 to which substrate 702 is fixed and silicon target 705, a high frequency voltage is applied by a high frequency power source 734. Gas pressure vessels 707, 708, 709 and 710 are connected with deposition chamber 702 through inflow valves 711, 712, 713 and 714, flow meters 715, 716, 717 and 178, outflow valves 719, 720, 721 and 722, respectively, and auxiliary valve 723. A desired gas can be introduced into deposition chamber 701 from gas pressure vessels 707, 708, 709 and 710.

Gas pressure vessel 707 contains H$_2$ which can be introduced into deposition chamber 701 so as to deposit a-Si:H on substrate 702 by sputtering of silicon target 705.

Gas pressure vessel 708 contains an atmosphere gas to be introduced into deposition chamber 701 for effecting sputtering.

Gas pressure vessel 709 and 710 are gas materials for introducing impurities into a-Si:H layer so as to control said layer to a type of 1-5, for example, PH$_3$, P$_2$H$_4$, B$_2$H$_6$, AsH$_3$ and the like are contained.

By using the apparatus of FIG. 2, there can be formed an a-Si:H layer on substrate 702. Main valve 724 is fully opened to evacuate deposition chamber 701 by exhausting air to the direction of arrow B, and then auxiliary valve 723, inflow valves 711–714 and out flow valves 719–722 to bring the pressure in deposition chamber 701 to a predetermined degree of vacuum.

Then, heater 704 is turned on to heat substrate 702 to a particular temperature. When an a-Si:H layer is formed by a sputtering method, the temperature of substrate 702 is usually 50°–350° C., preferably, 100°–200° C. This substrate temperature affects a growing speed of the layer, structure of the layer and presence or absence of voids, and determines partly physical properties of the layer thus formed. Therefore, substrate temperature should be sufficiently controlled. The substrate temperature may be kept at a constant temperature during forming the a-Si:H layer or may be raised or lowered or raised and lowered accordingly as the a-Si:H layer grows. For example, at the initial stage of formation of an a-Si:H layer the substrate temperature is kept at a relatively low temperature $T_1$ and when the a-Si:H layer grows to a certain extent, formation of a-Si:H layer is conducted in such a manner that the substrate temperature is raised from $T_1$ to a temperature $T_2$ which is higher than $T_1$ and at the final stage of formation of the a-Si:H layer the substrate temperature is lowered from $T_2$ to a temperature $T_3$ which is lower than $T_2$ to form the a-Si:H layer. In this way, it is possible to obtain an a-Si:H layer in which electrical and optical properties of the formed a-Si:H layer are constant to vary continuously in the thickness direction of the layer.

Since the layer growing speed of a-Si:H is slower than that of other materials such as Se and the like, as the layer thickness becomes thick, the a-Si:H (that near the substrate side) formed at the initial stage is considered to change its properties at the initial stage during the formation procedure. Therefore, in order to obtain an a-Si:H layer having uniform characteristics in the direction of thickness of layer, it is desirable to raise the substrate temperature from the beginning to the end of the layer formation.

This substrate temperature control procedure also can be employed in case of a glow discharge method.

After confirming that substrate 702 is heated to a predetermined temperature, inflow valves 711–714, outflow valves 719–722 and auxiliary valve 723 are closed.

While watching an outlet pressure gauge 731, valve 68 is gradually opened to control the outlet pressure of gas pressure vessel 708 to a predetermined pressure and then inflow valve 712 is fully opened to flow an atmosphere gas such as Ar gas into flow meter 716, and further, auxiliary valve 723 is opened and then while adjusting main valve 724 and outflow valve 720, the atmosphere gas is introduced into deposition chamber 701 and the chamber 701 is kept at a predetermined degree of vacuum.

Then, while watching outlet gauge 730, valve 726 is gradually opened to control the outlet pressure of gas pressure vessel 707. Then, inflow valve 711 is fully opened to let H$_2$ gas flow into flow meter 715, and while controlling main valve 724 and outflow valve 719, H$_2$ gas is introduced into deposition chamber 701 to maintain a predetermined vacuum. Introduction of H$_2$ gas into deposition chamber 701 is omitted when it is not necessary to incorporate H in an a-Si:H layer formed on substrate 702.

A flow rate of an atmosphere gas such as H$_2$, Ar and the like into deposition chamber is determined in such a manner that an a-Si:H layer of desired properties. For example, when an atmosphere gas and H$_2$ gas are mixed, a pressure of the gas mixture in deposition chamber 701 is usually $10^{-3}$-$10^{-1}$ Torr, preferably $5 \times 10^{-3}$-$3 \times 10^{-2}$ Torr. Ar gas may be replaced by a rare gas such as He.

When it is not necessarily required to dope an a-Si:H layer with an impurity, after introducing an atmosphere gas and H$_2$, or an atmosphere gas into deposition chamber 701 until the pressure becomes a predetermined degree of vacuum, a high frequency voltage is applied between a fixing member 703 to which substrate 702 is fixed and an electrode for sputtering by using a high frequency power source 734 at a predetermined frequency and a voltage and discharged and the formed ions of the atmosphere gas such as Ar ion sputter a silicon target to form an a-Si:H layer on substrate 702.

When impurities are introduced into an a-Si:H layer formed, a raw material gas for forming impurities is introduced into deposition chamber 701 from gas pressure vessel 709 or 710 upon forming an a-Si:H layer.

In case of the image forming member having the layer structure shown in FIG. 1 and FIG. 2, the charge generation layer is formed in a way as mentioned above.

In case of the image forming member having a depletion layer in a charge generation layer as shown in FIG. 3 through FIG. 6, a charge generation layer is formed in a way as shown below.

As mentioned above, an inner layer is formed on substrate 702 in a predetermined thickness and then an outer layer is formed to complete the whole layer of a charge generation layer in a manner as shown below.

As an example, in case of forming an inner layer by introducing only H$_2$ gas from gas pressure vessel 707 and an atmosphere gas from gas pressure vessel 708 into deposition chamber 701, an outer layer of a type different from a type of the inner layer is produced by introducing H$_2$ gas, an atmosphere gas and a raw material gas for impurities from gas pressure vessel 709 or 710 into deposition chamber 701.

As another example, in each case of forming an inner layer by introducing, for example, a mixture of H$_2$ gas, an atmosphere gas and a raw material gas for impurities into deposition chamber 701, an outer layer having a type different from that of the inner layer is formed by introducing a mixture of H$_2$ gas and an atmosphere gas, or a mixture of H$_2$ gas, an atmosphere gas and a raw material gas for impurities from gas pressure vessel 710 into deposition chamber 701.

As a further example, in case of forming an inner layer by introducing H$_2$ gas, an atmosphere gas and a raw material gas for impurities from gas pressure vessel 709 into deposition chamber 701, an outer layer is formed by introducing the same gases as used above except that the amount of introduction of a raw material gas for impurities into deposition chamber 701 per unit time is different from that in the above procedure.

By forming an inner layer and an outer layer, there is formed a depletion layer at a junction portion between the inner layer and the outer layer and thereby a charge generation layer of the electrophotographic image forming member according to the present invention.

When a charge generation layer having two depletion layers such as a layer structure of p.i.n, a layer structure of p+.p.n, a layer structure of n.p.i and the like is desired, the charge generation layer can be produced by appropriately selecting the above mentioned three methods.

With respect to FIG. 7, there is explained a sputtering method by high frequency electric field discharging, but a sputtering method by a direct current electric field discharging may be also used.

According to the sputtering method by applying a high frequency voltage, the frequency is usually 0.2–30 MHz, preferably 5–20 MHz and the discharge current density is usually 0.1–10 mA/cm$^2$, preferably 0.1–5 mA/cm$^2$, more preferably 1–5 mA/cm$^2$. For obtaining a sufficient power, there is employed usually a voltage of 100–5000 V, preferably 300–5000 V.

When a sputtering method is used, a growing speed of an a-Si:H layer is mainly determined by substrate temperature and discharging conditions and is a factor affecting physical properties of the formed layer. The growing speed of an a-Si:H layer for attaining the purpose of the present invention is usually 0.5–100 Å/sec., preferably 1–50 Å/sec.

In a way similar to a glow discharging method, an a-Si:H layer formed by doping with impurities can be also adjusted to n-type or p-type according to a sputtering method.

A method of introducing impurities is the same in both a sputtering method and a glow discharging method. For example, PH$_3$, P$_2$H$_4$, B$_2$H$_6$ or the like compound in a gaseous state is introduced into deposition chamber 701 upon forming an a-Si:H layer and the a-Si:H layer is doped with P or B as an impurity. An impurity may be incorporated in a formed a-Si:H layer by ion implantation.

Figure 8:
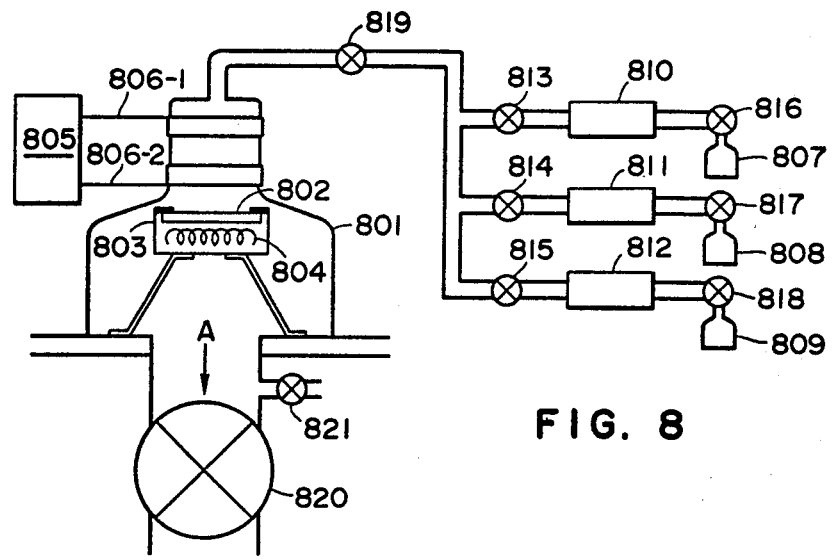
FIG. 8 is a schematic illustration of an apparatus which is used to prepare an electrophotographic image-forming member of the present invention in accordance with the capacitance type of glow discharging method.

FIG. 8 shows a glow discharge deposition apparatus for producing an a-Si:H layer by a capacitance type glow discharging method.

A glow-discharge deposition chamber 801 contains a substrate 802 for forming an a-Si:H layer thereon and fixed on a fixing member 803. Below substrate 802 there is a heater 804 for heating substrate 802. At the upper portion of deposition chamber 801 there is wound a capacitance type electrode 806-1, 806-2 connected with a high frequency power source 805. When the power source 805 is turned on, a high frequency is applied to the electrodes 806-1, 806-2 to cause a glow discharge in deposition chamber 801. The upper portion of deposition chamber 801 is connected with a gas introducing conduit through which a gas from gas pressure vessel 807, 808 or 809 is introduced into deposition chamber 801. Flow meters 810, 811 and 812 are used for detecting a flow rate of a gas, and flow rate controlling valves 813, 814 and 815, valves 816, 817, and 818, and an auxiliary valve 819 are provided.

The lower portion of deposition chamber 801 is connected with an exhausting apparatus (not shown) through a main valve 820. Valve 821 is used for breaking vacuum in deposition chamber 801.

By using a glow discharging deposition apparatus in FIG. 8, an a-Si:H layer having desired properties can be produced on substrate 802 as shown below.

A substrate 802 subjected to a particular cleaning treatment is fixed to a fixing member 803 with the cleaned surface kept upward, or a substrate 802 having a charge transport layer composed of an organic compound is fixed to fixing member 803.

Surface of substrate 802 may be cleaned as shown below. It can be cleaned with an alkali or acid, (a kind of chemical treatment), or by disposing a substrate cleaned to some extent in deposition chamber 801 at a fixed portion and then applying glow discharge. In the latter case, cleaning substrate 802 and formation of an a-Si:H layer can be carried out in the same system without breaking vacuum and thereby it can be avoided that dirty matters and impurities attach to the cleaned surface. After fixing substrate 802 to fixing member 803, main valve 820 is fully opened to evacuate deposition chamber 801 to bring the pressure down to about 10$^{-5}$ Torr. Then heater 804 starts to heat substrate 802 up to a predetermined temperature, and the temperature is kept. Then, auxiliary valve 819 is fully opened, and then valve 816 of gas pressure vessel 807 and valve 817 of gas pressure vessel 808 are fully opened. Gas pressure vessel 807 is, for example, for a diluting gas such as Ar and gas pressure vessel 808 is for a gas forming a-Si:H, for example, silicon hydride gas such as SiH$_4$Si$_2$H$_6$, Si$_4$H$_{10}$ or their mixture. Pressure vessel 809 may be used, if desired for storing a gas capable of incorporating impurities in an a-Si:H layer, for example, PH$_3$, P$_2$H$_4$, B$_2$H$_6$ and the like. Flow rate controlling valves 813 and 814 are gradually opened while observing flow meters 810 and 811 to introduce a diluting gas, e.g., Ar, and a gas for forming a-Si:H, e.g., SiH$_4$ into deposition chamber 801. The diluting gas is not always necessary, but only SiH$_4$ may be introduced into the system. When Ar gas is mixed with a gas for forming a-Si:H, e.g. SiH$_4$, and then introduced, the amount ratio may be determined depending upon each particular situation. Usually the gas for forming a-Si:H is more than 10 vol.% based on the diluting gas. As the diluting gas, a rare gas such as He may be used in place of Ar. When gases are introduced from pressure vessels 807 and 808 into deposition chamber 801, main valve 820 is adjusted to keep a particular vacuum degree, usually, an a-Si:H layer forming gas of 10$^{-1}$$^{2}$-3 Torr. Then, to electrodes 806-1 and 806-2 is applied a high frequency voltage, for example, 0.2–30 MHz, from high frequency power source 805 to cause glow discharge in deposition chamber 801, and SiH$_4$ is decomposed to deposit a-Si:H on substrate 802 to form an a-Si:H layer.

Impurities may be introduced into an a-Si:H layer to be formed by introducing a gas from pressure vessel 809 into deposition chamber 801 upon forming an a-Si:H photoconductive layer. By controlling valve 815, an amount of gas introduced into deposition chamber 801 from pressure vessel 809 can be controlled. Therefore, an amount of impurities incorporated in an a-Si:H layer can be optionally controlled and in addition, the amount may be varied in the direction of thickness of the a-Si:H layer.

In FIG. 8, the glow discharge deposition apparatus uses a glow discharge process of RF (radio frequency) capacitance type, but in place of said type process, there may be used a glow discharge process of RF inductance type or DC diode type. Electrodes for glow discharge may be disposed in or outside of deposition chamber 801.

In order to efficiently carry out glow discharge in a glow discharge apparatus for capacitance type as shown in FIG. 8, current density is usually 0.1–10 mA/cm$^2$, preferably 0.1–5 mA/cm$^2$, more preferably, 1–5 mA/cm$^2$, and further voltage voltage is usually 100–5000 V, preferably 300–5000 V, so as to obtain a sufficient power.

Characteristics of an a-Si:H layer depend on a temperature of substrate to a great extent and therefore, it is preferable to control the temperature strictly. The temperature of substrate according to the present invention is usually 50°-350° C., preferably 100°-200° C. so as to obtain an a-Si:H layer for electrophotography having desirable characteristics. In addition, the substrate temperature may be changed continuously or batchwise to produce desirable characteristics.

Figure 9:
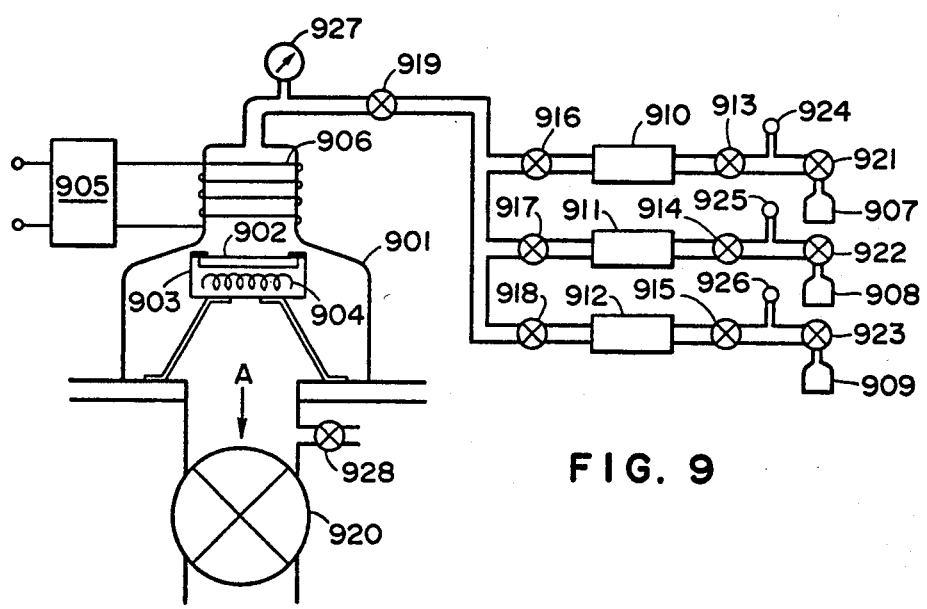
FIG. 9 is a schematic illustration of an apparatus which is used to prepare an electrophotographic image-forming member of the present invention in accordance with the inductance type of glow discharging method.

FIG. 9 illustrates diagrammatically a glow discharge deposition apparatus for producing a charge generation layer by inductance type glow discharge.

Glow discharge deposition chamber 901 contains substrate 902 on which an a-Si:H layer is formed. Substrate 902 is fixed to fixing member 903. Under substrate 902 is disposed heater 904 to heat substrate 902. Inductance coil 906 connected to a high frequency power source 905 is wound around the upper portion of deposition chamber 901. When the power source 905 is on, high frequency wave is applied to the coil 906 to cause glow discharge in deposition chamber 901. To the top of deposition chamber 901 is connected a gas introducing pipe capable of introducing gases in gas pressure vessels 907, 908 and 909 when required. The gas introducing pipe is equipped with flow meters 910, 911 and 912, inflow valves 913, 914 and 915 outflow valves 916, 917 and 918 and auxiliary valve 919.

The bottom portion of deposition chamber 901 is connected to an exhausting device (not shown) through main valve 920. Valve 928 is used for breaking vacuum in deposition chamber 901.

An a-Si:H layer having a desired characteristics is formed on substrate 902 by using the glow discharge deposition apparatus in FIG. 9.

Cleaned substrate 902 is fixed to fixing member 903 with the cleaned surface upward. After fixing a substrate 902 to a fixing member 903, deposition chamber 901 is evacuated to the direction shown by arrow A by fully opening a main valve 920 and thereby the pressure in system is brought down to about $10^{-5}$ Torr.

Then, auxiliary valve 919 is fully opened, and outflow valves 916, 917 and 918, and inflow valves 913, 914 and 915 are fully opened, and further flow meters 910, 911 and 912 are evacuated. Then, auxiliary valve 919, inflow valves 913, 914 and 915, and outflow valves 916, 917 and 918 are closed after deposition chamber 901 reaches a predetermined degree of vacuum, and heater 904 is turned on to heat substrate 902 to a predetermined temperature and then the temperature is kept. Gas pressure vessel 907 contains a gas for forming a-Si:H such as $SiH_4$, $Si_2H_6$, $Si_4H_{10}$ and mixtures thereof. Gas pressure vessels 908 and 909 contains gases for doping an a-Si:H layer with impurities so as to control the a-Si:H layer to a type of 1-5. The gases are, for example, $PH_3$, $P_2H_4$, $B_2H_6$, $AsH_3$ and the like.

After confirming that substrate 902 reaches a predetermined temperature, valve 921 of gas pressure vessel 907 is opened, and pressure of outlet pressure gauge is adjusted to a predetermined pressure, and then inflow valve 913 is gradually opened to flow a gas for forming a-Si:H such as $SiH_4$ and the like into flow meter 910. Auxiliary valve 919 is opened to a predetermined position, and while watching Pirani gauge 929, outflow valve 916 is gradually opened to adjust a flow rate of a gas fed to deposition chamber 901 from gas pressure vessel 907. Where it is not necessary to dope the formed a-Si:H layer with the impurities, main valve 920 is controlled watching Pirani gauge 927 at a time of introducing a gas for forming a-Si:H into deposition chamber 901 from gas pressure vessel 907 to obtain a predetermined degree of vacuum, usually $10^{-2}$-3 Torr as a gas pressure upon forming the a-Si:H layer.

Then a high frequency power having a predetermined high frequency (usually 0.2–30 MHz) is supplied to an induction coil 906 wound around deposition chamber 901 from a high frequency power source 905 to cause glow discharge in deposition chamber 901 and thereby a gas for forming a-Si:H and as $SiH_4$ is decomposed to form an a-Si:H layer on substrate 902.

If impurities are to be introduced into the a-Si:H layer, a gas for forming impurities is introduced into deposition chamber 901 from gas pressure vessel 908 or 909 upon forming the a-Si:H layer.

A charge generation layer of an image forming member as shown in FIGS. 1 and 2 may be produced as mentioned above.

Image forming members having a depletion layer in a charge generation layer as shown in FIG. 3 through FIG. 6 may be produced by the following methods.

As mentioned above, an inner layer is formed on substrate 902 in a predetermined thickness and then an outer layer is formed to complete the whole layer of a charge generation layer in a manner as shown below.

As an example, in case of forming an inner layer by introducing only a gas for forming a-Si:H from gas pressure vessel 907 into deposition chamber 901, an outer layer of a type different from a type of the inner layer is produced by introducing a gas for forming a-Si:H from vessel 907 and a raw material gas for impurities from gas pressure vessel 908 or 909 into deposition chamber 901.

As another example, in case of forming an inner layer by introducing, for example, a gas for forming a-Si:H from gas pressure vessel 907 and a raw material gas for impurities from vessel 908 into deposition chamber 901, an outer layer having a type different from that of the inner layer is formed by introducing a gas for forming a-Si:H from gas pressure vessel 907, or a mixture of a gas for forming a-Si:H and a raw material gas for impurities from gas pressure vessel 909 into deposition chamber 901.

As a further example, in case of forming an inner layer by introducing a mixture of a gas for forming a-Si:H from vessel 907 and, for example, a raw material gas for impurities from gas pressure vessel 908 into deposition vessel 901, an outer layer is formed by introducing a mixture as mentioned above except that the amount ratio of the gas for forming a-Si:H and a gas for impurities is different from that used in the above.

By forming an inner layer and an outer layer, there is formed a depletion layer at a junction portion between the inner layer and the outer layer. When a charge generation layer having two depletion layers such as a layer structure of p.i.n, a layer structure of p.n.i, a layer structure of n.i.p and the like is desired, the charge generation layer can be produced by appropriately selecting the above mentioned three methods.

In the apparatus of FIG. 9, characteristics of an a-Si:H layer depend on a temperature of substrate to a great extent and therefore, it is preferable to control the temperature strictly. The temperature of substrate is usually 50°-350° C., preferably 100°-200° C. so as to obtain an a-Si:H layer for electrophotography having desirable characteristics. In addition, the substrate temperature may be changed continuously or batchwise to produce desirable characteristics. Growing speed of the a-Si:H layer also affects physical properties of the resulting a-Si:H layer to a great extent, and according to the present invention, it is usually 0.5–100 Å/sec., preferably 1–50 Å/sec.

Other procedure conditions mentioned in case of FIG. 8 may be used for the apparatus of FIG. 9.

The invention will be understood more readily by reference to the following examples; however, these examples are intended to illustrate the invention and are not to be construed to limit the scope of the invention.

EXAMPLE 1

In accordance with the procedure described below, an electrophotographic image-forming member of the present invention was prepared by using an apparatus as shown in FIG. 8, and image forming treatment was applied to the image-forming member.

An aluminum substrate was cleaned in such a manner that the surface of the substrate was treated with a 1% solution of NaOH and sufficiently washed with water and then dried. This substrate, which was 1 mm in thickness and 10 cm×5 cm in size, was firmly disposed at a fixed position in a fixing member 803 placed at a predetermined position in a deposition chamber 801 for glow discharge so that the substrate was kept apart from a heater 804 equipped to the fixing member 803 by about 1.0 cm.

The air in the deposition chamber 801 was evacuated by opening fully a main valve 820 to bring the chamber to a vacuum degree of about $5 \times 10^{-5}$ Torr. The heater 804 was then ignited to heat uniformly the aluminum substrate to 150° C., and the substrate was kept at this temperature. A subsidiary valve 819 was fully opened, and subsequently a valve 816 of a bomb 807 to which Ar was charged and a valve 817 of a bomb 808 which was filled with $SiH_4$ were also opened fully, and thereafter, flow amount controlling valves 813, 814 were gradually opened so that Ar gas and $SiH_4$ gas were introduced into the deposition chamber 801 from the bombs 807, 808. At that time, the vacuum degree in the deposition chamber 801 was brought to and kept at about 0.075 Torr. by regulating the main valve 820.

A high frequency power source 805 was switched on to apply a high frequency voltage of 13.56 MHz between electrodes 806-1 and 806-2 so that a glow discharge was caused, thereby depositing and forming an a-Si:H layer on the aluminum substrate. At that time, the glow discharge was initiated with an electric power of 5 W. Further, the growth rate of the a-Si:H layer was about 4 angstroms per second and the vacuum deposition was effected for about 20 minutes and further the thus formed a-Si:H layer had a thickness of 0.5 microns.

After completion of the deposition, while the main valve 820, valves 816 and 817, flow amount controlling valves 813 and 814, and subsidiary valve 819 were closed, a leak valve 821 was opened to break the vacuum state in the deposition chamber 801. The formed structure was taken out from the apparatus.

On the thus formed a-Si:H layer was coated a coating liquid which had been prepared by dissolving a mixture of TNF and PVK (1:1 in ratio by weight) in a mixed liquid of toluene and cyclohexane (1:1 in ratio by volume), in accordance with the doctor blade method. This structure was allowed to stand in atmosphere at 80° C. for about two hours to evaporate the toluene and cyclohexane. The formed TNF:PVK layer had a thickness of about 20 microns after drying. The image-forming treatment was applied to the thus prepared image-forming member in the following manner.

Positive corona discharge was applied to the surface of the image-forming member with a power source voltage of 6,000 V in a dark place. The imagewise exposure was then conducted in an exposure quantity of 15 lux.sec. to form an electrostatic image, which was then developed with a negatively charged toner in accordance with the cascade method. The developed image was transferred to a transfer paper and fixed. At this time, an extremely sharp transferred image with a high resolution was obtained although the period of time required until completion of the developing step since the charging step was only several seconds. Further, even when the treatment period of time exceeded 10 seconds, the contrast of the transferred image was hardly decreased.

EXAMPLE 2

An a-Si:H layer of 0.5 micron in thickness was formed on an aluminum substrate in the same manner as in Example 1. Onto the a-Si:H layer was applied a coating liquid prepared by dissolving a mixture of TNF and polyethyleneterephthalate (hereinafter called "PET") (0.4:1 in ratio by weight) in a liquid mixture of toluene and cyclohexane, in accordance with the doctor blade method. This structure was allowed to stand in atmosphere at 80° C. for about two hours to evaporate the solvent in the applied coating liquid. The TNF:PET layer was of about 20 microns thickness after drying.

The thus prepared image-forming member was subjected to the positive corona charging with a voltage of 6,000 V in a dark place and the image exposure was conducted in an exposure quantity of 15 lux.sec. from the image forming surface so that an electrostatic image was formed. The electrostatic image was then developed with a negatively charged toner in the cascade manner. The developed image was transferred to a transfer paper and finally fixed. The obtained image was extremely sharp with a high resolution.

EXAMPLE 3

In Example 1, an a-Si:H layer having a thickness of 0.5 microns was formed on the aluminum substrate in the same manner as in Example 1 except that the glow discharge was carried out while the $SiH_4$ gas was mixed with $B_2H_6$ gas in a ratio of 0.01%. On the a-Si:H layer was coated a coating liquid which had been prepared by dissolving a mixture of tetracene and polycarbonate resin (1:10 by weight ratio) in toluene, in accordance with the doctor blade method. It was allowed to stand in atmosphere at 80° C. for about two hours to evaporate the solvent. The layer of tetracene and polycarbonate resin had a thickness of about 20 microns after drying.

The thus prepared image-forming member was subjected to negative corona discharge with a voltage of 5,500 V in a dark place and the image exposure was effected in an exposure quantity of 15 lux sec. from the side of the image-forming surface of the member to form an electrostatic image, which was then developed with a positively charged toner in the cascade method. The developed image was transferred to a transfer paper and fixed to obtain an image with an extremely good sharpness and high resolution.

EXAMPLE 4

An aluminum substrate having a thickness of 1 mm and a size of 10 cm×50 cm was cleaned in such a manner that the surface of the substrate was treated with a 1% solution of NaOH and sufficiently washed with water and then dried. On the surface of the substrate was coated coating liquid which had been obtained by dissolving unpolymerized imidazopyrrolone powder in a mixed liquid of dimethylacetamide and N-methyl-2-pyrrolidone, in the doctor blade method. This structure was allowed to stand in atmosphere at about 80° C. for about one hour to evaporate the dimethylacetamide and N-methyl-2-pyrrolidone, and further to stand in atmosphere at about 300° C. for about three hours for the purpose of heat treatment. The polyimidazopyrrolone layer formed on the aluminum substrate was 20 microns in thickness after drying.

Further, an a-Si:H layer was formed on the polyimidazopyrrolone layer in accordance with the following sputtering method using an apparatus shown in FIG. 7.

The substrate 702 having the polyimidazopyrrolone layer was firmly disposed at a predetermined position of fixing member 703 positioned in a deposition chamber 701 so that the polyimidazopyrrolone layer might be faced upwards and kept apart from a heater 704 by 1.0 cm or so. Further, a target 705 of polycrystalline silicon having a purity of 99.999% was fixed over the substrate 702 so that it might be kept apart from the substrate 702 by about 8.5 cm. A main valve 724, subsidiary valve 723, outflow valves 719 and 720 were each opened to evacuate the air in the deposition chamber 701 and in flow meters 715 and 716 so that the vacuum degree was brought to about $1 \times 10^{-6}$ Torr. Thereafter, the valves 723, 719 and 720 were closed. The heater 704 was ignited to heat uniformly the substrate 702 to about 150° C., and the substrate was kept at that temperature.

A valve 723 was fully opened, and subsequently a valve 726 of a bomb 707 was also fully opened. Thereafter, an inflow valve 711 and outflow valve 719 were gradually opened to introduce $H_2$ gas into the deposition chamber 701 from the bomb 707 while the vacuum degree in the deposition chamber 701 was brought to $5.5 \times 10^{-4}$ Torr by regulating the main valve 724 with the flow meter 715 being carefully observed. Successively, after fully opening a valve 727 of a bomb 708, an inflow valve 712 and outflow valve 720 were gradually opened with a flow meter 716 being carefully observed, to introduce Ar gas into the deposition chamber 701 in which the vacuum degree was adjusted to $5 \times 10^{-3}$ Torr.

A high frequency power source 734 was switched on to apply a high frequency voltage of 13.56 MHz and 1 KV between the substrate 702 and polycrystalline silicon target 705 so that a discharge was caused, thereby, starting formation of an a-Si:H layer on the polyimidazopyrrolone layer. This operation was conducted continuously with the growth rate of the a-Si:H layer being controlled to about two angstroms per second for 40 minutes. The formed a-Si:H layer was about 0.5 micron in thickness.

The thus prepared image-forming member was used to effect image formation process in the same manner as in Example 2. As a result, a good transferred image with a high quality was obtained.

EXAMPLE 5

In the same manner as in Example 4, a polyimidazopyrrolone layer having a thickness of 15 microns and an a-Si:H layer having a thickness of 0.5 microns were formed on the aluminum substrate. Further, thereon was formed a TNF:PET layer having a thickness of 15 microns in the same procedure as in Example 2.

Image forming process was conducted by using the image-forming member thus obtained in the same manner as in Example 2. As a result, a transferred image of high quality was obtained.

EXAMPLE 6

An image-forming member was prepared according to the same procedure as in Example 1 except that as the substrate was used a sheet of polyethyleneterephthalate having a thickness of 100 microns on which an aluminum thin layer was formed by the vapor deposition. The thus obtained member was employed to conduct the image forming process in the same manner as in Example 1 except that the image exposure was carried out from the side of the substrate of the image-forming member. The transferred image as thus obtained was formed to be of high quality.

EXAMPLE 7

In the same procedure as in Example 4, a polyimidazopyrrolone layer of 15 microns thick was formed on the aluminum substrate and an a-Si:H layer of 0.5 micron thick was overlaid on the polyimidazopyrrolone layer. Thereafter, polycarbonate resin was coated onto the a-Si:H layer to form a transparent insulating layer having a thickness of 15 microns after drying.

To the insulating layer surface of the thus prepared image-forming member was applied negative corona discharge with a charging voltage of 5,500 V as the primary charging simultaneously with the whole surface exposure being uniformly effected from the side of the insulating layer. Since then, after passage of 5 seconds or so, positive corona discharge was conducted with a voltage of 6,000 V as the secondary charging simultaneously with the image exposure being conducted in an exposure quantity of 20 lux.sec., and the whole surface of the image-forming member was then exposed uniformly to form an electrostatic image. This image was developed with a positively charged toner according to the cascade method, transferred to a transfer paper and fixed so that a sharp image with a high resolution was obtained.

EXAMPLE 8

In Example 1, an a-Si:H layer having a thickness of 0.5 microns was formed on the aluminum substrate in the same manner as in Example 1 except that the glow discharge was carried out while the $SiH_4$ gas was mixed with $B_2H_6$ gas in a ratio of 0.01%. On the a-Si:H layer was coated a coating liquid which had been obtained by dissolving poly-N-vinylcarbazole in toluene, in accordance with the doctor blade method. It was allowed to stand in atmosphere at 80° C. for about two hours to evaporate the solvent. The poly-N-vinylcarbazole layer had a thickness of about 20 microns after drying.

The thus prepared image-forming member was subjected to negative corona discharge with a voltage of 5,500 V in a dark place and the image exposure was effected in an exposure quantity of 15 lux.sec. from the side of the image-forming surface to form an electrostatic image, which was then developed with a positively charged toner in the cascade method. The developed image was transferred to a transfer paper and fixed to obtain an image with an extremely good sharpness and high resolution.

EXAMPLE 9

An image-forming member was prepared by using an apparatus as shown in FIG. 9 placed in a sealed clean room in accordance with the following procedure.

A molybdenum substrate 902 having a thickness of 0.2 mm and a diameter of 5 cm$\phi$, the surface of which had been cleaned, was securely disposed in a fixing member 903 placed in a deposition chamber 901 for glow discharge. The substrate 902 was heated with accuracy of $\pm 0.5°$ C. by means of a heater 904 disposed in the fixing member 903. At that time, the temperature of the substrate was measured in such a manner that the back side of the substrate was brought into direct contact with a chromel-alumel thermocouple.

The closed state of all valves in the apparatus was confirmed. A main valve 920 was fully opened to evacuate the air in the deposition chamber 901 so that the vacuum degree in the chamber was brought to about $5 \times 10^{-6}$ Torr. The input voltage of the heater 904 was increased and changed while the temperature of the molybdenum substrate was observed so that the substrate might be kept at 150° C.

Subsequently, a subsidiary 919 and outflow valves 916, 917 and 918 were fully opened to evacuate sufficiently the air in flow meters 910, 911, 912. As a result, those meters were brought to vacuum state. The valves 916, 917, 918 and 919 were closed. Thereafter, a valve 921 of a bomb 907 to which silane gas of 99.999% purity had been charged and a valve 922 of a bomb 908 which had been filled with diborane gas were opened so that the pressure in outlet pressure gauges 924, 925 was adjusted to 1 kg/cm$^2$. Inflow valves 913 and 914 were gradually opened to introduce the silane gas and diborane gas into the flow meters 910 and 911, respectively. Successively, the subsidiary valve 919 was gradually opened, and further the outflow valves 916 and 917 were also gradually opened. At this time, the flow amount of the silane gas and diborane gas was adjusted so that the reading of the flow meter 911 might be 0.08% based on the reading of the flow meter 910. While the reading of a Pirani gauge 927 was carefully observed, the subsidiary valve 919 was regulated to bring the deposition chamber 901 to a vacuum degree of $1 \times 10^{-2}$ Torr. After the inside pressure of the chamber 901 became stable, the main valve 920 was gradually closed so that the reading of the Pirani gauge might become 0.075 Torr.

After confirming that the inside pressure of the chamber 901 was stabilized, a high frequency power source 905 was switched on in order to input a high frequency power of 5 MHz to an induction coil 906 so that a glow discharge was initiated with an input power of 30 W in the inside of the portion winded with the coil 906 (that is, the upper area of the chamber). The same condition was continued and kept for one hour. Since then, the high frequency power source 905 was switched off to stop the glow discharge (formation of an inner layer). The valve 922 of the bomb 908 and the outflow valve 917 were closed.

Successively, the high frequency power source 905 was again switched on in order to give rise to a glow discharge in the chamber 901. The glow discharge was further continued for one hour. Thereafter, the heater 904 as well as the high frequency power source 905 was turned off (formation of an outer layer).

After the substrate temperature reached 100° C., the outflow valve 916 and subsidiary valve 919 were closed, while the main valve 920 was fully opened to bring the inside of the chamber 901 to $10^{-5}$ Torr or below. Thereafter, the main valve 920 was closed, and the inside of the chamber 901 was brought to atmospheric pressure by way of a leak valve 928, and then the substrate 902 was taken out from the apparatus. As the result of the above operation, an a-Si:H layer (charge generation layer) was formed on the substrate 902 and such layer had a total thickness of about two microns.

Next, a TNF:PVK layer of about 20 microns in thickness was further formed on the above a-Si:H layer in accordance with the same procedure and condition as in Example 1.

The thus prepared image-forming member was subjected to the image forming process given below. First, positive corona discharge was applied with a power source voltage of 6,000 V to the surface of the member on which an image was formed, in a dark place. The image exposure was conducted in an exposure quantity of 15 lux.sec. from the side of the image forming surface to form an electrostatic image, which was then developed with a negatively charged toner according to the cascade method. The developed image was transferred to a transfer paper and fixed. At that time, although the treatment period of time required until the completion of the developing step since the charging step was only several seconds, a sharp transferred image with a high resolution was obtained. Further, even when the treatment period of time exceeded 10 seconds, lowering of the contrast of the transferred image was hardly observed.

EXAMPLE 10

An a-Si:H layer having a thickness of two microns was formed on a molybdenum substrate by using the same procedure and condition as in Example 9.

Further, a TNF:PET layer having a thickness of about 20 microns was formed on the a-Si:H layer in accordance with the same procedure and condition as in Example 2.

The thus obtained image-forming member was subjected to the following image forming process. Positive corona discharge was applied with a power source voltage of 6,000 V to the image-forming member in a dark place. Next, the image exposure was effected in an exposure quantity of 15 lux.sec. from the surface on which images are formed, to form an electrostatic image, which was then developed with a negatively charged toner according to the cascade method. The developed image was transferred to a transfer paper and fixed. As a result, an extremely sharp image with high resolution was obtained.

EXAMPLE 11

An a-Si:H layer (charge generation layer) of two microns in thickness having therein a depletion layer was formed on a molybdenum substrate according to the same procedure as in Example 9 except that the forming order of the outer and inner layers was inverted. Further, a tetracene:polycarbonate resin layer of about 20 microns in thickness was formed on the a-Si:H layer in accordance with the same procedure and condition as in Example 3 to obtain an image-forming member.

To the image-forming member was applied negative corona discharge with a power source voltage of 5,500 V in a dark place. Image exposure was conducted in an exposure quantity of 15 lux.sec. from the surface of the member on which images were to be formed, to form an electrostatic image, which was then developed with a positively charged toner. The developed image was transferred to a transfer paper followed by fixation. As a result, a sharp image with high resolution was obtained.

EXAMPLE 12

An aluminum substrate having a thickness of 1 mm and a size of 10 cm×5 cm was cleaned in such a manner that the surface of the substrate was treated with a 1% solution of NaOH and sufficiently washed with water and then dried. A polyimidazopyrrolone layer having a thickness of about 20 microns was formed on the surface of the substrate by using the same procedure and condition as in Example 4. Further, an a-Si:H layer (charge generation layer) was formed on the polyimidazopyrrolone layer in accordance with the following sputtering method by means of an apparatus shown in FIG. 7.

The substrate 702 having the polyimidazopyrrolone layer was securely fixed to a fixing member 703 disposed in a predetermined position of a deposition chamber 701 so that the polyimidazopyrrolone layer might be faced upward and the substrate 702 was kept apart from a heater 704 by 1.0 cm or so. A polycrystalline silicon (purity: 99.999%) target 705 was fixed onto an electrode opposed to the substrate 702 so that it might be opposed and made parallel to the substrate and further kept apart from the substrate by about 4.5 cm.

The air in the deposition chamber 701 was evacuated by fully opening a main valve 724 to bring the chamber to a vacuum degree of $5\times10^{-7}$ Torr. At that time, all valves of the apparatus except for the main valve 724 were closed. A subsidiary valve 723 and outflow valves 719, 720, 721, 722 were opened to evacuate sufficiently the air. Thereafter, the outflow valves 719, 720, 721, 722 and subsidiary valve 723 were closed.

The substrate 802 was kept at 200° C. by means of the heater 704. A valve 726 of a bomb 707 which had been filled up with hydrogen gas (purity: 99.99995%) was opened to adjust the outlet pressure to 1 kg/cm$^2$ while at outlet pressure gauge 730 was observed. Subsequently, an inflow valve 711 was gradually opened to allow the hydrogen gas to flow into a flow meter 715, and successively the outflow valve 719 was gradually opened and further the subsidiary valve 723 was also opened. While the inside pressure of the chamber 701 was measured by means of a pressure gauge 725, the outflow valve 719 was regulated to introduce the hydrogen gas into the deposition chamber 701 so that the inside pressure of the chamber 701 might reach up to $5\times10^{-5}$ Torr.

A valve 727 of a bomb 708 to which argon gas (purity: 99.9999%) had been charged was opened and regulated so that the reading of an outlet pressure gauge 731 might indicate 1 kg/cm$^2$. Thereafter, an inflow valve 712 was opened and further the outflow valve 720 was gradually opened to allow the argon gas to flow into the chamber 701. The outflow valve 720 was gradually opened until the pressure gauge 725 indicated $5\times10^{-4}$ Torr, and under that condition, the flow amount of the argon gas was stabilized. Thereafter, the main valve 724 was gradually closed to bring the inside pressure of the chamber 701 to $1\times10^{-2}$ Torr.

Successively, a valve 728 of a bomb 709 containing therein diborane gas (purity: 99.9995%) was opened to adjust the reading of an outlet pressure gauge 732 to 1 kg/cm$^2$. An inflow valve 713 was opened and the outflow valve 721 was gradually opened. At that time, the outflow valve 721 was regulated while the reading of a flow meter 717 was observed, in order to control the flow amount of the diborane gas so that such flow amount might be about 1.0% based on the flow amount of the hydrogen gas indicated by the flow meter 715.

After the flow meters 715, 716 and 717 became stabilized, a high frequency power source 734 was switched on in order to input an alternating power of 13.56 MHz, 1.6 KV between the target 705 and fixing member 703. Under this condition, stable discharging was continued for 40 minutes to form an inner layer.

Thereafter, the high frequency power source 734 was turned off to discontinue the discharging. Successively, the outflow valves 719, 720 and 721 were closed, while the main valve 724 was fully opened to evacuate the gas present in the chamber 701 so that vacuum degree in the chamber was brought up to $5\times10^{-7}$ Torr.

Subsequently, similarly to the case of the inner layer formation, the hydrogen gas and argon gas were introduced into the deposition chamber 701 and the opening degree of the main valve 724 was regulated to bring the inside pressure of the chamber 701 to $2\times10^{-2}$ Torr. A valve 729 of a bomb 710 containing therein phosphine gas (purity: 99.9995%) was opened to regulate the outlet pressure so that the reading of an outlet pressure gauge 733 might indicate 1 kg/cm$^2$. An inflow valve 714 and outflow valve 722 were gradually opened while a flow meter 718 was observed, in order to adjust the flow amount of the phosphine gas to 1.0% based on that of the hydrogen gas. After the flow amount of the hydrogen, argon and phosphine gases became stable, the high frequency power source 734 was switched on to apply a voltage of 1.6 KV thereby conducting the discharge. Under that condition, the discharge was continued for 40 minutes. Thereafter, the power source 734 and heater 704 were turned off. When the substrate temperature was decreased to 100° C. or below, the outflow valves 719, 720 and 722 were closed and the subsidiary valve 723 was also closed, while the main valve 724 was fully opened to evacuate the gas in the chamber 701. Thereafter, the main valve 724 was closed, whereas a leak valve 735 was opened to bring the chamber to atmospheric pressure. The substrate was taken out from the apparatus. The formed a-Si:H layer (charge generation layer) had a thickness of two microns.

To the thus obtained image-forming member was applied positive corona charging with a power source voltage of 6,000 V in a dark place. The image exposure was effected from the side of the surface of the member on which an image was to be formed. in an exposure quantity of 15 lux.sec. to form an electrostatic image, which was then developed with a negatively charged toner in accordance with the cascade method. The developed image was transferred to a transfer paper and fixed. As a result, a clear image with high resolution was obtained.

EXAMPLE 13

In the same manner as in Example 12, a polyimidazopyrrolone layer of about 15 microns thick and a-Si:H layer (charge generation layer) of one micron thick were formed on the aluminum substrate. Further, in the same manner as in Example 2, a TNF:PET layer of about 15 microns thick was formed.

The image forming process was conducted by using the thus prepared image-forming member in the same procedure as in Example 12. As a result, a transferred image of high quality was obtained.

EXAMPLE 14

An image-forming member was prepared according to the same procedure as in Example 9 except that as the substrate was used a sheet of polyethyleneterephthalate having a thickness of 100 microns on which an aluminum thin layer was formed by the vapor deposition. The thus obtained member was employed to conduct the image-forming process in the same manner as in Example 9 except that the image exposure was carried out from the side of the substrate of the image-forming member. The transferred image as thus obtained was found to be of high quality.

EXAMPLE 15

In the same procedure as in Example 12, a polyimidazopyrrolone layer of about 15 microns thick was formed on an aluminum substrate and an a-Si:H layer (charge generation layer) of about one micron thick was overlaid on the polyimidazopyrrolone layer. Thereafter, polycarbonate resin was coated onto the a-Si:H layer to form a transparent insulating layer having a thickness of 15 microns after drying.

To the insulating layer surface of the thus prepared image-forming member was applied negative corona discharge with a charging voltage of 5,500 V as the primary charging simultaneously with the whole surface exposure being uniformly effected from the side of the insulating layer surface. Since then, after passage of 5 seconds on so, positive corona discharge was conducted with a charging voltage of 6,000 V as the secondary charging simultaneously with the image exposure being conducted in an exposure quantity of 20 lux.sec., and the whole surface of the image-forming member was then exposed uniformly to form an electrostatic image. This image was developed with a positively charged toner according to the cascade method, transferred to a transfer paper and fixed so that a sharp image with a high resolution was obtained.

EXAMPLE 16

ITO ($In_2O_3:S_nO_2=20:1$ shaped, burned at 600° C.) layer having a thickness of 1200 angstroms was formed on one side surface of a glass substrate (trade name:- Corning 7059, supplied by Dow Corning Co.) having a thickness of 1 mm and a size of 4×4 cm, the both sides of which had been polished, in accordance with the electron beam vapor deposition procedure. The obtained structure was heated in atmosphere of oxygen at 500° C.

The structure was disposed in the fixing member 903 in the apparatus shown in FIG. 9 similar to that used in Example 9 so that the ITO layer might be faced upward. Subsequently, in accordance with the same procedure as in Example 9, the inside of the deposition chamber 901 for glow discharge was adjusted to a vacuum degree of $5 \times 10^{-6}$ Torr and the substrate temperature was kept at 170° C., and thereafter the silane gas in the bomb 907 was allowed to flow into the chamber 901 so that the inside of the chamber 901 was brought to 0.8 Torr. A valve 923 of a bomb 909 containing therein phosphine gas was opened to adjust the reading of the outlet pressure gauge 926 to 1 kg/cm². The inflow valve 915 was opened and the outflow valve 918 was regulated while the flow meter 912 was observed in order to control the flow amount of the phosphine gas so that it might be 0.1% based on the flow amount of the silane gas from the bomb 907. Under such condition, the phosphine gas was mixed with the silane gas from the bomb 907 and allowed to flow into the deposition chamber 901.

After the gas inflow become stable and the inside pressure of the chamber 901 was maintained at the constant level and further the substrate temperature was kept at 170° C., the high frequency power source 905 was switched on to give rise to a glow discharge in a similar manner to that in Example 9. This glow discharge was continued for 30 minutes, and thereafter the high frequency power source 905 was turned off to discontinue the glow discharge, thereby completing the formation of an inner layer. The outflow valves 916 and 918 were closed, while the subsidiary valve 919 and main valve 920 were fully opened to bring the inside of the chamber 901 to a vacuum degree of $5 \times 10^{-6}$ Torr. The subsidiary valve 919 and main valve 920 were then closed. Next, the outflow valve 916 was gradually opened and the subsidiary valve 919 and main valve 920 were regulated to adjust the flow amount of the silane gas to the same flow amount as in case of forming the inner layer. The power source 905 was switched on to cause a glow discharge, which was continued for one hour. Thereafter, the heater 904 and power source 905 were turned off. After the substrate temperature was decreased to 100° C., the outflow valve 916 was closed, while the main valve 920 and subsidiary valve 919 were fully opened to bring the inside of the chamber 901 to $10^{-5}$ Torr or below. The subsidiary valve 919 and main valve 920 were then closed and the inside of the chamber 901 was brought to atmospheric pressure by means of the leak valve 928. The substrate was taken out which had an a-Si:H layer of about 3.5 microns in total thickness.

A TNF:PVK layer having a thickness of 30 microns was formed on the a-Si:H layer in the same manner as in Example 1. The thus obtained image-forming member was tested with respect to the image formation. The member was subjected to the image forming process comprising positive corona charging with a voltage of 6 KV, image exposure conducted from the glass substrate side and development with a negatively charged developer. As a result, a good image was obtained with sufficient practicality.

EXAMPLE 17

An image-forming member was prepared by using an apparatus as shown in FIG. 9 placed in a sealed clean room in accordance with the following procedure.

A molybdenum substrate 902 having a thickness of 0.2 mm and a diameter of 5 cmϕ, the surface of which had been cleaned, was securely disposed in a fixing member 903 placed in a deposition chamber 901 for glow discharge. The substrate 902 was heated with accuracy of ±0.5° C. by means of a heater 904 disposed in the fixing member 903. At that time, the temperature of the substrate was measured in such a manner that the back side of the substrate was brought into direct contact with a chromel-alumel thermocouple.

The closed state of all valves in the apparatus was confirmed. A main valve 920 was fully opened to evacuate the air in the deposition chamber 901 so that the vacuum degree in the chamber was brought to about $5 \times 10^{-6}$ Torr. The input voltage of the heater 904 was increased and changed while the temperature of the molybdenum substrate was observed so that the substrate was kept at 150° C.

Subsequently, a subsidiary valve 919 and outflow valves 916, 917 and 918 were fully opened to evacuate sufficiently the air in flow meters 910, 911 and 912. As a result, the insides of those meters were brought to vacuum state. The valves 916, 917, 918, 913, 914 and 915 were closed. Thereafter, a valve 921 of a bomb 907 to which silane gas of 99.999% purity had been charged was opened so that the pressure in an outlet pressure gauge 924 was adjusted to 1 kg/cm$^2$. An inflow valve 913 was gradually opened to introduce the silane gas into the flow meter 910. Successively, the outlet valve 916 was gradually opened and the subsidiary valve 919 was gradually opened. At that time, the subsidiary valve 919 was regulated with the reading of a Pirani gauge 927 being carefully observed, in order to bring the inside of the chamber 901 to $1 \times 10^{-2}$ Torr. After the inside pressure of the chamber 901 became stable, the main valve 920 was gradually closed so that the reading of the Pirani gauge might become 0.5 Torr.

After confirming that the inside pressure of the chamber 901 was stabilized, a high frequency power source 905 was switched on in order to input a high frequency power of 5 MHz to an induction coil 906 so that a glow discharge was initiated with an input power of 30 W in the inside of chamber. Under the same condition, an a-Si:H layer (inner layer) was allowed to grow on the substrate and such condition was continued for 5 hours. The power source 905 was turned off to discontinue the glow discharge. A valve 922 of a bomb 908 containing therein diborane gas (purity: 99.999%) was opened to adjust the pressure at an outlet pressure gauge 925 to 1 kg/cm$^2$, and an inflow valve 914 was gradually opened to cause the diborane gas to flow in a flow meter 911. Thereafter, an outlet valve 917 was gradually opened and regulated so that the reading of the flow meter 911 might indicate 0.08% of the flow amount of the diborane gas based on that of the silane gas from the bomb 907.

Successively, the high frequency power source 905 was again switched on in order to give rise to a glow discharge in the chamber 901. The glow discharge was further continued for one hour. Thereafter, the heater 904 as well as the high frequency power source 905 was turned off (formation of an outer layer).

After the substrate temperature reached 100° C., the outflow valves 916, 917 and subsidiary valve 919 were closed, while the main valve 920 was fully opened to bring the inside of the chamber 901 to $10^{-5}$ Torr or below. Thereafter, the main valve 920 was closed, and the inside of the chamber 901 was brought to atmospheric pressure by way of a leak valve 928, and then the substrate 902 was taken out from the apparatus. As the result of the above operation, the formed a-Si:H layer had a total thickness of about 6 microns.

The thus prepared image-forming member was subjected to the image-forming process. Corona charging with $\ominus 6$ KV was applied to the image-forming member for 0.2 sec. Immediately thereafter, the image exposure was effected. At that time, the image-forming member was exposed to light from a xenon lamp, from which light having a wavelength range of 550 nm or below was excluded by using a filter (trade name: V-058, supplied by Toshiba Kasei Kogyo K.K.), in an exposure quantity of 15 lux.sec. through a transmission type test chart. Immediately thereafter, the development was conducted with a positively charged developer (containing toner and carrier) to obtain a good toner image on the surface of the image-forming member. The toner image was then transferred onto a transfer paper while corona charging of $\oplus 5$ KV was applied. As a result, a clear image of high density was obtained which was further excellent in the resolution, gradation and reproducibility.

On the other hand, corona charging with $\oplus 6$ KV was applied to the image-forming member, and the image exposure was effected in accordance with the same procedure and condition as those in the foregoing. Further, the development was conducted with a negatively charged developer. The obtained image was found to be poor in the image density and unclear as compared with the image obtained in the foregoing.

Further, the image-forming process first mentioned in this example was repeated except that three color filters, i.e., blue, green and red filters were used in place of the filter V-058, respectively. In either case, substantially the same, excellent image was obtained on the transfer paper.

EXAMPLE 18

In accordance with the following operation, an image-forming member was prepared by using an apparatus shown in FIG. 7.

A platinum thin film having a thickness of about 800 angstroms was deposited onto a stainless steel plate having a thickness of 0.2 mm and a size of 10×10 cm, the surface of which had been cleaned, in accordance with the electron beam vacuum-deposition. The thus treated stainless steel plate was used as a substrate 702.

The substrate 702 was fixed in a fixing member 703 enclosing a heater 704 and a thermocouple in a deposition chamber 701. A polycrystalline silicon (purity: 99.999%) target 705 was securely placed on an electrode opposed to the substrate 702 so that it might be opposed to and made parallel to the substrate 702 and further kept apart from the substrate by about 4.5 cm.

A main valve 724 was fully opened to evacuate the air in the inside of the chamber 701 to bring the chamber to a vacuum degree of $5 \times 10^{-7}$ Torr or so. At that time, other valves than the main valve 724 were all closed. A subsidiary valve 723 and outflow valves 719, 720, 721 and 722 were opened to evacuate sufficiently the air, and then the outflow valves 719, 720, 721, 722 and subsidiary valve 723 were closed.

The substrate 702 was heated by heater 704 and kept at 200° C. A valve 726 of a bomb 707 containing therein hydrogen gas (purity: 99.99995%) was opened to adjust the outlet pressure to 1 kg/cm$^2$ while an outlet pressure gauge 730 was observed. Subsequently an inflow valve 711 was gradually opened to allow the hydrogen gas to flow into a flow meter 715, and successively the outflow valve 719 was gradually opened and further the subsidiary valve 723 also opened.

While the inside pressure of the chamber 701 was measured by a pressure gauge 725, the outflow valve 719 was regulated to introduce the hydrogen gas into the chamber 701 so that the inside pressure of the chamber 701 might reach up to $5 \times 10^{-5}$ Torr.

A valve 727 of a bomb 708 to which argon gas (purity: 99.9999%) had been charged was opened and regulated so that the reading of an outlet pressure gauge 731 might indicate 1 kg/cm$^2$. Thereafter, an inflow valve 712 was opened and further the outflow valve 720 was gradually opened to allow the argon gas to flow into the chamber 701. The outflow valve 720 was gradually opened until the pressure gauge 725 indicated $5\times10^{-4}$ Torr, and under that condition, the flow amount of the argon gas was stabilized. Thereafter, the main valve 724 was gradually closed to bring the inside pressure of the chamber 701 to $1\times10^{-2}$ Torr.

Subsequently, a valve 729 of a bomb 710 containing therein phosphine gas (purity: 99.9995%) was opened to regulate the outlet pressure so that the reading of an outlet pressure gauge 733 might indicate 1 kg/cm². An inflow valve 714 was opened and an outflow valve 722 was gradually opened and regulated while a flow meter 718 was observed, in order to adjust the flow amount of the phosphine gas to about 1.0% based on that of the hydrogen gas indicated by the flow meter 715. After the flow meters 715, 716 and 717 became stable, the high frequency power source 734 was switched on to apply alternating power of 13.56 MHz, 1.6 KV between the target 705 and fixing member 703 thereby conducting the discharge. Under that condition, the discharge was continued for 4 hours to form an inner layer. Thereafter, the power source 734 was turned off to discontinue the discharging. Successively, the outflow valves 719, 720 and 722 were closed, while the main valve 724 was fully opened to evacuate the gas in the chamber 701 so that the vacuum degree was adjusted to $5\times10^{-7}$ Torr. Thereafter, similarly to the case of forming the inner layer as mentioned in the foregoing, hydrogen gas and argon gas were introduced into the chamber 701 and the main valve 724 was regulated to bring the inside pressure of the chamber 701 to $2\times10^{-2}$ Torr.

Subsequently, a valve 728 of a bomb 709 containing therein diborane gas (purity: 99.9995%) was opened to adjust the reading of an outlet pressure gauge 732 to 1 kg/cm². An inflow valve 713 was opened and the outflow valve 721 was gradually opened. At that time, the outflow valve 721 was regulated while the reading of a flow meter 717 was observed, in order to control the flow amount of the diborane gas so that such flow amount might be about 1.0% based on the flow amount of the hydrogen gas indicated by the flow meter 715.

After the flow amount of hydrogen, argon and diborane gases became stabilized, a high frequency power source 734 was switched on in order to input a voltage of 1.6 KV, thereby causing a discharge. Under that condition, such discharge was continued for 40 minutes. Thereafter, the power source 734 was turned off and the heater 704 was also switched off. When the substrate temperature reached 100° C. or below, the outflow valves 715, 716 and 717 were closed, and further the subsidiary valve 723 was closed, while the main valve 724 was fully opened to evacuate the gas present in the chamber 701. The main valve 724 was then closed, and the leak valve 735 was opened to bring the inside pressure of the chamber 701 to the atmospheric pressure. Thereafter, the substrate 702 was taken out. In this case, the formed a-Si:H layer had a total thickness of 8 microns.

The thus prepared image-forming member was used to conduct the same image-forming process as in Example 17 except that corona discharge with $\ominus 6$ KV was applied and a positively charged toner was used. As a result, a good image was obtained which was excellent in the resolution, gradation and image density.

EXAMPLE 19

An ITO (In$_2$O$_3$:SnO$_5$=20:1 shaped, burned at 600° C.) layer having a thickness of 1200 angstroms was formed on one side surface of a glass substrate trade name: Corning 7059, supplied by Dow Corning Co.) having a thickness of 1 mm and a size of 4×4 cm, both sides of which had been polished, in accordance with the electron beam vapor deposition procedure. The obtained structure was heated in atmosphere of oxygen at 500° C.

The structure was disposed in the fixing member 903 in the apparatus shown in FIG. 9 similar to that used in Example 17 so that the ITO layer might be faced upward. Subsequently, in accordance with the same procedure as in Example 17, the inside of the deposition chamber 901 for glow discharge was adjusted to a vacuum degree of $5\times10^{-6}$ Torr and the substrate temperature was kept at 170° C., and thereafter the silane gas in the bomb 907 was allowed to flow into the chamber 901 so that the inside of the chamber 901 was brought to 0.8 Torr. A valve 923 of a bomb 909 containing therein phosphine gas was opened to adjust the reading of the outlet pressure gauge 926 to 1 kg/cm². The inflow valve 915 was opened and the outflow valve 918 was regulated while the flow meter 912 was observed in order to control the flow amount of the phosphine gas so that it might be 0.1% based on the flow amount of the silane gas. Under such condition, the phosphine gas was mixed with the silane gas and allowed to flow into the deposition chamber 901.

After the gas inflow become stable and the inside pressure of the chamber 901 was maintained at the constant level and further the substrate temperature was kept at 170° C., the high frequency power source 905 was switched on to give rise to a glow discharge in a similar manner to that in Example 17. This glow discharge was continued for 30 minutes, and thereafter the high frequency power source 905 was turned off to discontinue the glow discharge, thereby completing the formation of an inner layer. The outflow valves 916 and 918 were closed, while the subsidiary valve 919 and main valve 920 were fully opened to bring the inside of the chamber 901 to a vacuum degree of $5\times10^{-6}$ Torr. The subsidiary valve 919 and main valve 920 were then closed. Next, the outflow valve 916 was gradually opened and the subsidiary valve 919 and main valve 920 were regulated to adjust the flow amount of the silane gas to the same flow amount as in case of forming the foregoing inner layer. The power source 905 was switched on to cause a glow discharge, which was continued for 8 hours. Thereafter, the heater 904 and power source 905 were turned off. After the substrate temperature was decreased to 100° C., the outflow valve 916 was closed, while the main valve 920 and subsidiary valve 919 were fully opened to bring the inside of the chamber 901 to $10^{-5}$ Torr or below. The subsidiary valve 919 and main valve 920 were then closed and the inside of the chamber 901 was brought to atmospheric pressure by means of the leak valve 928. The substrate was taken out which had an a-Si:H layer of about 11 microns in total thickness.

The thus obtained image-forming member was tested with respect to the image formation. The member was subjected to the image forming process comprising corona charging with a voltage. Of $\ominus 6$ KV, image exposure conducted from the back side and development with a positively charged developer. As a result, a good image was obtained with sufficient practicality.

EXAMPLE 20

The same glass substrate as in Example 19, on which ITO was deposited, was used to form a structure similar to that finally obtained in Example 19 in accordance with the same procedure and condition as in Example 19.

Subsequently, the inflow valve 915 and outflow valve 918 were closed. Heating by means of the heater 904 was maintained, while the high frequency power source 905 was switched off. A valve 922 of a bomb 908 which had been filled up with diborane gas was opened to adjust the pressure at an outlet pressure gauge 925 to 1 kg/cm$^2$. An inlet valve 914 was gradually opened to allow the diborane gas to flow into a flow meter 911. An outlet valve 917 was further gradually opened and regulated to control the flow amount of the diborane gas so that the reading of the flow meter 911 might indicate 0.08% based on the flow amount of the silane gas. Under that condition, the flow amount of the diborane gas into the chamber 901 was stabilized along with the flow amount of the silane gas. Succesively, the power source 905 was again switched on to give rise to a glow discharge. This glow discharge was maintained for 45 minutes. Thereafter, the heater 904 and power source 905 were switched off. After the substrate temperature reached 100° C., the outflow valves 916 and 917 were closed, while the main valve 920 was fully opened to bring the chamber 901 to 10$^{-5}$ Torr or below. The subsidiary valve 919 and main valve 920 were closed, and the inside of the chamber was brought to the atmospheric pressure by means of the leak valve 928. The substrate was then taken out from the chamber. The thus formed a-Si:H layer was of about 12 microns in the total thickness.

The obtained image-forming member was used to carry out the same image forming process as in Example 17 except that corona charging with $\ominus$6 KV was effected and a positively charged developer was used. As a result, a toner image of an extremely good quality and a high contrast was obtained on a transfer paper.

EXAMPLE 21

An MgF$_2$ layer having a thickness of 2,000 angstroms was formed on an aluminum plate having a thickness of 0.1 mm and a size of 4×4 cm, the surface of which had been polished with a buff into a surface like a mirror surface and cleaned, in accordance with the electron beam deposition. This structure was used as a substrate. The substrate was securely placed on the fixing member 903 in the apparatus shown in FIG. 9 similarly to Example 17 so that the MgF$_2$ layer might be faced upward.

In accordance with the procedure as in Example 17, the deposition chamber 901 for glow discharge and all gas conduits were brought to a vacuum degree of 5×10$^{-6}$ Torr and the substrate temperature was kept at 220° C. The silane gas was allowed to flow into the chamber 901 from the bomb 907 in the same manner as in Example 17 to bring the inside pressure of the chamber 901 to 1.0 Torr. After the flow amount of the silane gas and the substrate temperature became stabilized, the high frequency power source 905 was switched on so that a glow discharge started. Under this condition, the glow discharge was continued for 5 hours. Thereafter, the power source 905 was switched off to discontinue the glow discharge. Successively, the valves 923, 915, 918 were opened and regulated with the reading of the flow meter 912 being carefully observed, in order to control the flow amount of the phosphine gas from the bomb 909 so that it might be 0.05% based on the flow amount of the silane gas. The phosphine gas was then introduced into the chamber 901 with its stabilized flow amount. The high frequency power source 905 was again switched on to give rise to a glow discharge. During the glow discharge, the outflow valve 918 was gradually opened so that the flow amount of the phosphine gas based on that of the silane gas might be increased to 0.06% from the initial amount, i.e., 0.05% for about 10 minutes, and the glow discharge was continued for one hour. Thereafter, the power source 905 and heater 904 were switched off. After the substrate temperature was decreased to 100° C. or below, the outflow valves 916 and 918 were closed. The main valve 920 was then fully opened to bring the chamber 901 to 10$^{-5}$ Torr or below. The subsidiary valve 919 and main valve 920 were closed, while the leak valve 928 was opened to bring the chamber 901 to the atmospheric pressure. The substrate was taken out from the chamber. The thus formed a-Si:H layer had a total thickness of about 7.5 microns.

The thus obtained image-forming member was subjected to the same image forming process as in Example 17 except that positive corona charging was conducted with $\oplus$6 KV and a negatively charged developer was used. As a result, an extremely good image was obtained.

The image-forming member was fixed to a drum for photosensitive member, i.e. an aluminum drum having no photosensitive layer of a commercially available copying machine (trade name: NP-L7, supplied by CANON K.K., a partially modified test machine) and subjected to the image-forming process comprising charging with $\oplus$6 KV, image exposing, developing with negatively charged liquid developer, liquid-squeezing simultaneous with negative charging, and transferring simultaneous with positive charging. As a result, a good image was obtained on a plain paper. In addition, even when such image-forming process was repeated continuously 100,000 times, the quality of the obtained images remained unchanged.

EXAMPLE 22

An aluminum substrate having a thickness of 0.1 mm and a size of 4×4 cm, the surface of which had been cleaned, was disposed on the fixing member 903 in the apparatus shown in FIG. 9 similarly to the case of Example 17. In accordance with the same procedure as in Example 17, the air in the deposition chamber 901 and gas conduit was evacuated to bring them to a vacuum degree 5×10$^{-6}$ Torr, and the substrate was kept at 250° C. The silane gas was allowed to flow into the chamber 901 according to the valve operation of Example 17 so that the inside pressure of the chamber 901 was adjusted to 0.3 Torr.

The valve 922 of the bomb 908 which had been filled up with diborane gas was opened to adjust the reading of the outlet pressure gauge 925 to 1 Kg/cm$^2$. The inflow valve 914 was gradually opened and also the outflow valve 917 was gradually opened so that the reading of the flow meter 911 might indicate 0.15% based on the flow amount of the silane gas. Thus, the diborane gas was allowed to flow into the chamber 901. After the flow amount of the silane gas and diborane gas became stabilized and the substrate temperature was stabilized at 250° C., the power source 905 was switched on to cause a glow discharge. Under the same conditions, the glow discharge was conducted for 30 minutes and continued. The outflow valve 917 for the diborane gas was gradually closed and regulated while the flow meter 911 was observed, in order to control the flow amount of the diborane gas so that such flow amount might be 0.05% based on that of the silane gas. Under this condition, the glow discharge was further continued for 6 hours. Thereafter, the outflow valves 916 and 917 were closed so that the inside of the chamber 901 was adjusted to a vacuum degree of $5 \times 10^{-6}$ Torr. Successively, the silane gas was allowed to flow into the chamber 901 in the same manner so that the chamber 901 was brought to 0.3 Torr. The valve 923 of the bomb 909 to which phosphine gas had been charged was opened to adjust the outlet pressure to 1 Kg/cm$^2$, and the inflow valve 915 and outflow valve 918 were gradually opened and regulated while the flow meter 912 was observed, in order to adjust the flow amount of the phosphine gas to 0.08% based on that of the silane gas. The phosphine gas was mixed with the silane gas and allowed to flow into the chamber 901. After the gas flow became stabilized, the power source 905 was switched on to give rise to a glow discharge. The glow discharge was continued for 45 minutes. Thereafter, the power source 905 and heater 904 were switched off. After the substrate temperature reached 100° C., the outflow valves 916 and 918 were both closed, while the main valve 920 was fully opened to bring the chamber 901 to 10$^{-5}$ Torr or below. The subsidiary valve 919 and main valve 920 were closed, and the leak valve was opened to bring the chamber 901 to the atmospheric pressure. The substrate was then taken out. The formed a-Si:H layer had a total thickness of about 9 microns.

The back side, i.e., the aluminum surface of the thus obtained structure was brought into close contact with an adhesive tape and then immersed perpendicularly into a 30% solution of polycarbonate resin in toluene. The structure was drawn up at a speed of 1.5 cm/sec. so that a polycarbonate resin layer having a thickness of 15 microns was formed on the a-Si:H layer. Thereafter, the adhesive tape was removed.

The thus obtained image-forming member was fixed to a drum for a photosensitive member, i.e. an aluminum drum having no photosensitive layer of a commercially available copying machine (trade name: NP-L7, supplied by CANON K.K., a partially modified test machine) and subjected to the image-forming process comprising the primary charging with $\oplus$7 KV, image exposing simultaneous with AC charging with 6 KV, developing with a negatively charged liquid developer, liquid-squeezing (roller squeezing) and transferring simultaneous with charging with $\oplus$5 KV. As a result, a sharp image of a high contrast was obtained on a plain paper. Even when the process was continuously repeated, 100,000 times, the obtained images retained the initial excellent image quality.

What we claim is:

1. An electrophotographic process which comprises the steps of:

applying a charging treatment to an image forming member for electrophotography, said image forming member comprising a substrate and a charge generation layer comprising an inner region containing hydrogenated amorphous silicon and an outer region containing a hydrogenated amorphous silicon, said charge generation layer being electrosensitive to electromagnetic wave and having a depletion layer formed by the junction of said regions, said regions having different electric properties, said charging treatment conducted under a charging polarity sufficient to broaden the width of said depletion layer to prevent charge carriers from being injected into the charge generation layer from the substrate, and irradiating said image forming member with an electromagnetic wave carrying information, thereby forming an electrostatic image.

2. An electrophotographic process according to claim 1, wherein a doping impurity is incorporated in either one of the two layers in an amount of $10^{15}$–$10^{19}$ cm$^{-3}$.

3. An electrophotographic process according to claim 1, wherein a P-type impurity is incorporated in any one of the two layers.

4. An electrophotographic process according to claim 3, wherein the concentration of the P-type impurity ranges from cm$^{-3}$.

5. An electrophotographic process according to claim 1, wherein an N-type impurity is incorporated in either one of the two layers.

6. An electrophotographic process according to claim 5, wherein the concentration of the N-type impurity ranges from $10^{15}$–$10^{19}$ cm$^{-3}$.

7. An electrophotographic process according to claim 1, wherein either one of the two layers is of P-type.

8. An electrophotographic process according to claim 1, wherein either one of the two layers is of N-type.

9. An electrophotographic process according to claim 1, wherein one of the two layers is of P-type and the other is N-type.

10. An electrophotographic process according to claim 1, wherein the charge generation layer contains from 1–40 atomic percent of hydrogen.

11. An electrophotographic process according to claim 1, wherein the member further comprises a barrier layer.

12. An electrophotographic process according to claim 1, wherein a doping impurity is incorporated in the charge generation layer.

13. An electrophotographic process according to claim 12, wherein the selected impurity is of N-type.

14. An electrophotographic process according to claim 13, wherein the amount of the N-type impurity is from $10^{15}$–$10^{19}$ cm$^{-3}$.

15. An electrophotographic process according to claim 12, wherein the selected impurity is of P-type.

16. An electrophotographic process according to claim 15, wherein the amount of the P-type impurity is from $10^{15}$–$10^{19}$ cm$^{-3}$.

17. An electrophotographic process according to claim 12, wherein the selected impurities include N-type and P-type impurities.

18. An electrophotographic process according to claim 17, wherein the amount of the N-type impurity is from $10^{15}$–$10^{19}$ cm$^{-3}$.

19. An electrophotographic process according to claim 17, wherein the amount of the P-type impurity is from $10^{15}$–$10^{19}$ cm$^{-3}$.

20. An electrophotographic process according to claim 12, wherein the amount of the selected impurity is from $10^{15}$–$10^{19}$ cm$^{-3}$.

21. An electrophotographic process for electrophotography according to claim 1, in which said two layers have different semiconductive properties.

* * * * *